(12) United States Patent  
Niimi et al.

(10) Patent No.: US 9,070,785 B1
(45) Date of Patent: Jun. 30, 2015

(54) HIGH-K / METAL GATE CMOS TRANSISTORS WITH TIN GATES

(71) Applicant: Texas Instruments Incorporated, Dallas, TX (US)

(72) Inventors: Hiroaki Niimi, Cohoes, NY (US); Brian K. Kirkpatrick, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/567,507

(22) Filed: Dec. 11, 2014

Related U.S. Application Data

(60) Provisional application No. 61/922,498, filed on Dec. 31, 2013.

(51) Int. Cl.
*H01L 21/8238* (2006.01)
*H01L 21/28* (2006.01)
*H01L 21/324* (2006.01)
*H01L 29/66* (2006.01)

(52) U.S. Cl.
CPC .... *H01L 21/82385* (2013.01); *H01L 21/28008* (2013.01); *H01L 21/324* (2013.01); *H01L 29/66545* (2013.01); *H01L 21/823842* (2013.01)

(58) Field of Classification Search
CPC ............... H01L 27/0922; H01L 21/28088; H01L 21/324; H01L 21/823842; H01L 29/66545
See application file for complete search history.

(56) References Cited

U.S. PATENT DOCUMENTS

2010/0109095 A1* 5/2010 Li et al. .......................... 257/392
2010/0127336 A1* 5/2010 Chambers et al. ............. 257/369

* cited by examiner

*Primary Examiner* — Mary Wilczewski
*Assistant Examiner* — Toniae Thomas
(74) *Attorney, Agent, or Firm* — Jacqueline J. Garner; Frank Cimino

(57) ABSTRACT

An integrated circuit with a thick TiN metal gate with a work function greater than 4.85 eV and with a thin TiN metal gate with a work function less than 4.25 eV. An integrated circuit with a replacement gate PMOS TiN metal gate transistor with a workfunction greater than 4.85 eV and with a replacement gate NMOS TiN metal gate transistor with a workfunction less than 4.25 eV. An integrated circuit with a gate first PMOS TiN metal gate transistor with a workfunction greater than 4.85 eV and with a gate first NMOS TiN metal gate transistor with a workfunction less than 4.25 eV.

19 Claims, 36 Drawing Sheets

HIGH-K / METAL GATE CMOS TRANSISTORS WITH TIN GATES

CROSS-REFERENCE TO RELATED APPLICATIONS

This application claims the benefit of priority under U.S.C. §119(e) of U.S. Provisional Application 61/922,498.

FIELD OF INVENTION

This invention relates to the field of integrated circuits. More particularly, this invention relates to integrated circuits with high dielectric constant gate dielectric and metal gate transistors.

BACKGROUND

Until recently, integrated circuits utilized primarily transistors with polysilicon gates and silicon dioxide or nitrided silicon dioxide gate dielectrics.

Complementary Metal-Oxide-Semiconductor (CMOS) transistors with high dielectric constant (hi-k) dielectrics and metal gates were introduced as technologies scaled to 28 nm and below to combat short channel effects and to improve performance of the highly scaled transistors. The hi-k dielectrics provide improved capacitive control of the transistor channel by avoiding an apparent increase in gate dielectric thickness due to depletion of carriers in the polysilicon grains near the gate dielectric interface.

A significant challenge with hi-k/metal gate transistors is achieving the optimum workfunction for the best transistor performance. The workfunction of the gate for p-channel metal-oxide-semiconductor (PMOS) transistors is preferably greater than about 4.8 eV and the workfunction for n-channel metal-oxide-semiconductor (NMOS) transistors is preferably less than about 4.3 eV.

Processing in conventional hi-k/metal gate manufacturing may be very complicated and expensive to achieve a different work function on NMOS and PMOS transistors. For example, NMOS transistors may have a different gate metal and or may have a different hi-k gate dielectric than PMOS transistors.

There are primarily four different process flows for forming hi-k/metal gate transistors: hi-k last replacement gate; hi-k first replacement gate; hi-k last gate first; and hi-k first gate last. In replacement gate transistor flows, conventional polysilicon gate transistors are formed first and then the polysilicon gate is removed and replaced with a metal gate. In gate first process flows, the metal gate transistors are formed similar to conventional polysilicon gate transistors but with a metal gate. In hi-k last process flows, a silicon dioxide dielectric is first formed and later removed and replaced with a hi-k dielectric prior to depositing the metal gate. In hi-k first process flows, the hi-k dielectric is deposited first and gate material is stripped off the hi-k dielectric and replaced with metal gate. The hi-k last process flows are more complicated than hi-k first process flows. They require more masking steps but avoid exposing the hi-k dielectric to chemicals that may degrade the hi-k dielectric. Replacement gate process flows are more complicated than gate first process flows but allow more flexibility in setting the work functions of the transistors.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed with a thick TiN metal gate with a workfunction greater than 4.85 eV and with a thin TiN metal gate with a work function less than 4.25 eV. An integrated circuit is formed with a replacement gate PMOS TiN metal gate transistor with a workfunction greater than 4.85 eV and with a replacement gate NMOS TiN metal gate transistor with a workfunction less than 4.25 eV. An integrated circuit is formed with a gate first PMOS TiN metal gate transistor with a workfunction greater than 4.85 eV and with a gate first NMOS TiN metal gate transistor with a workfunction less than 4.25 eV.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
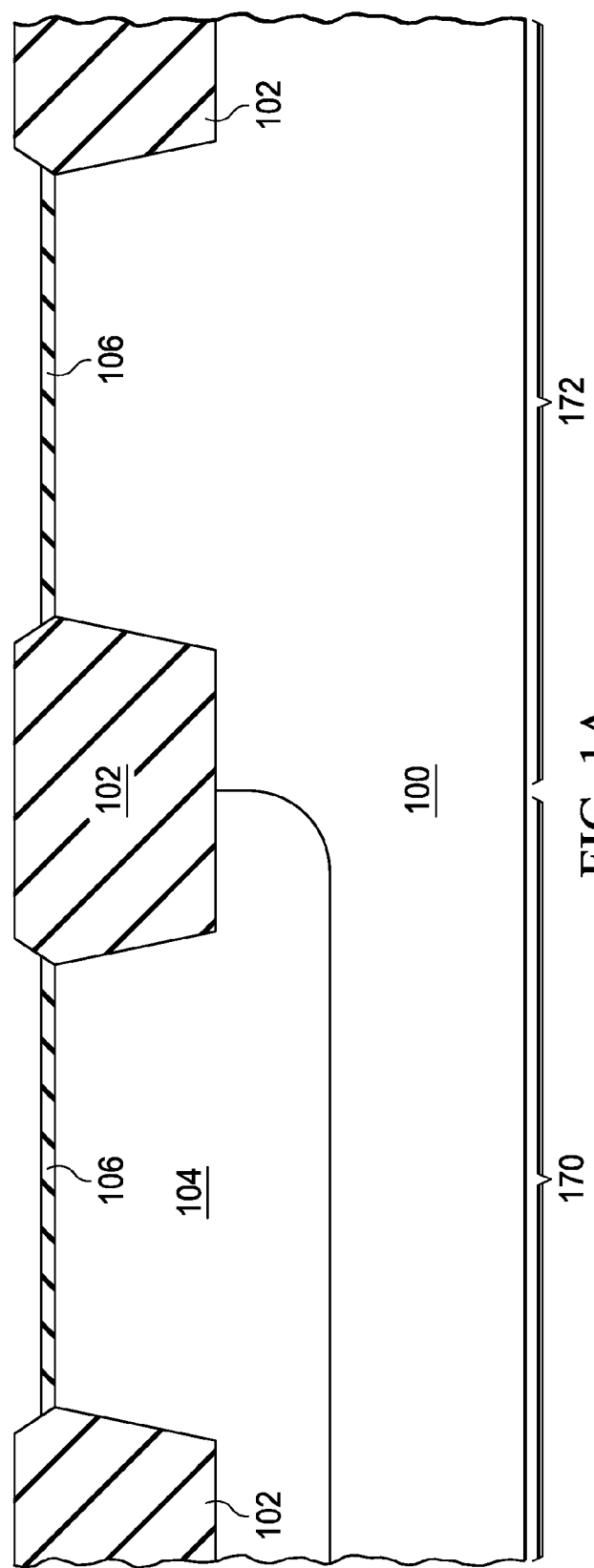
FIGS. 1A-1L are illustrations of steps in the fabrication of integrated circuit with high-k last, replacement metal gate CMOS transistors formed according to principles of the invention.
Figure 1B:
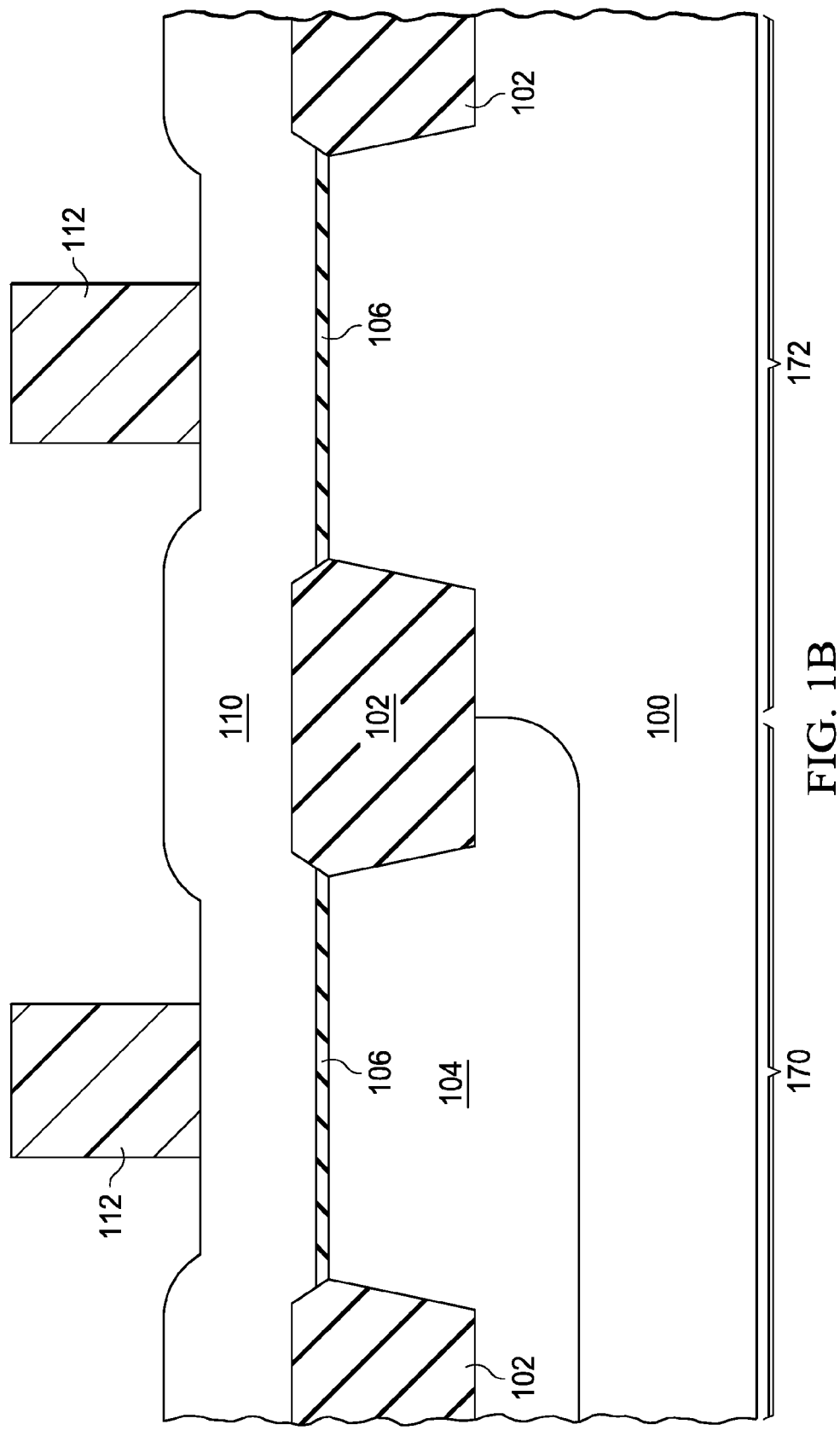
Figure 1C:
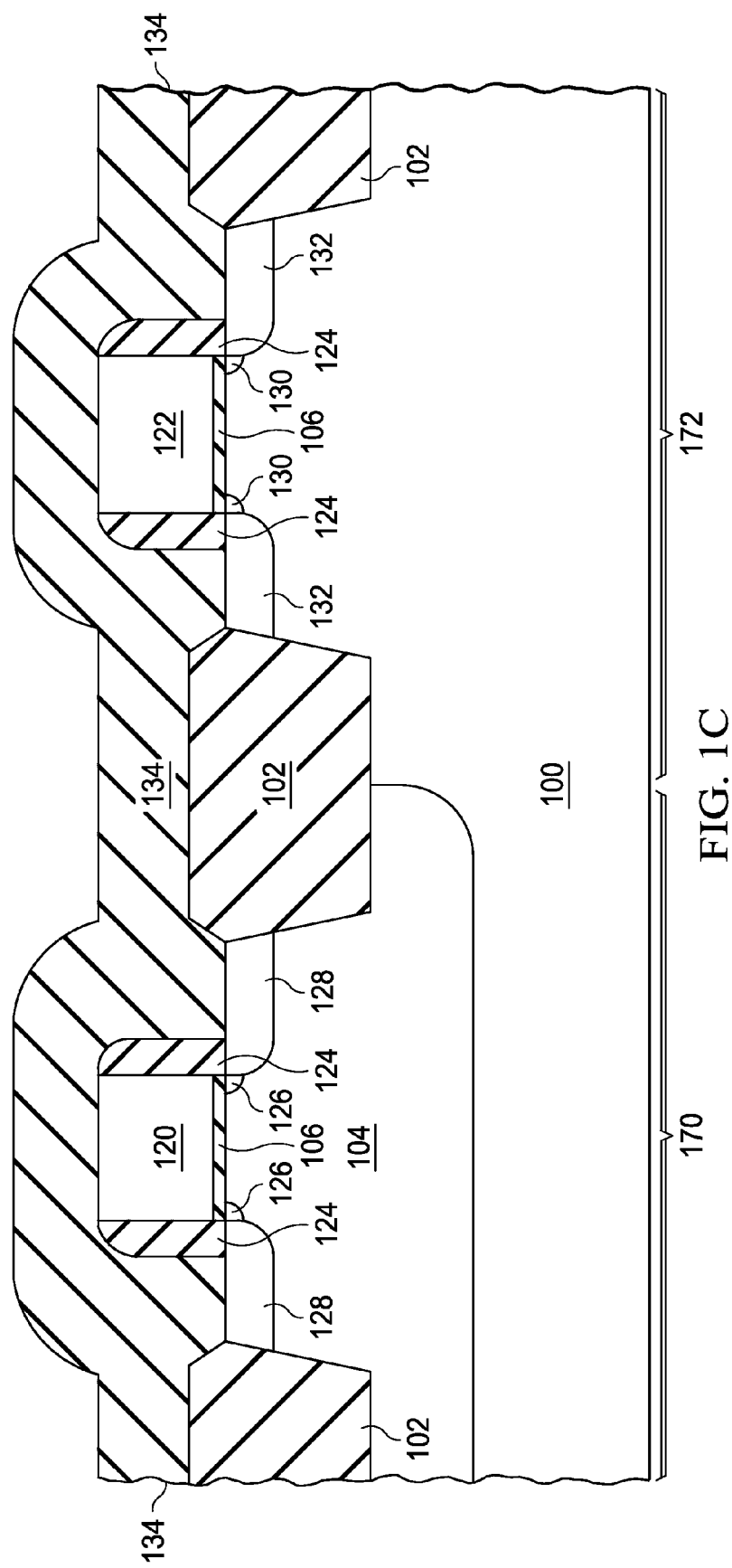
Figure 1D:
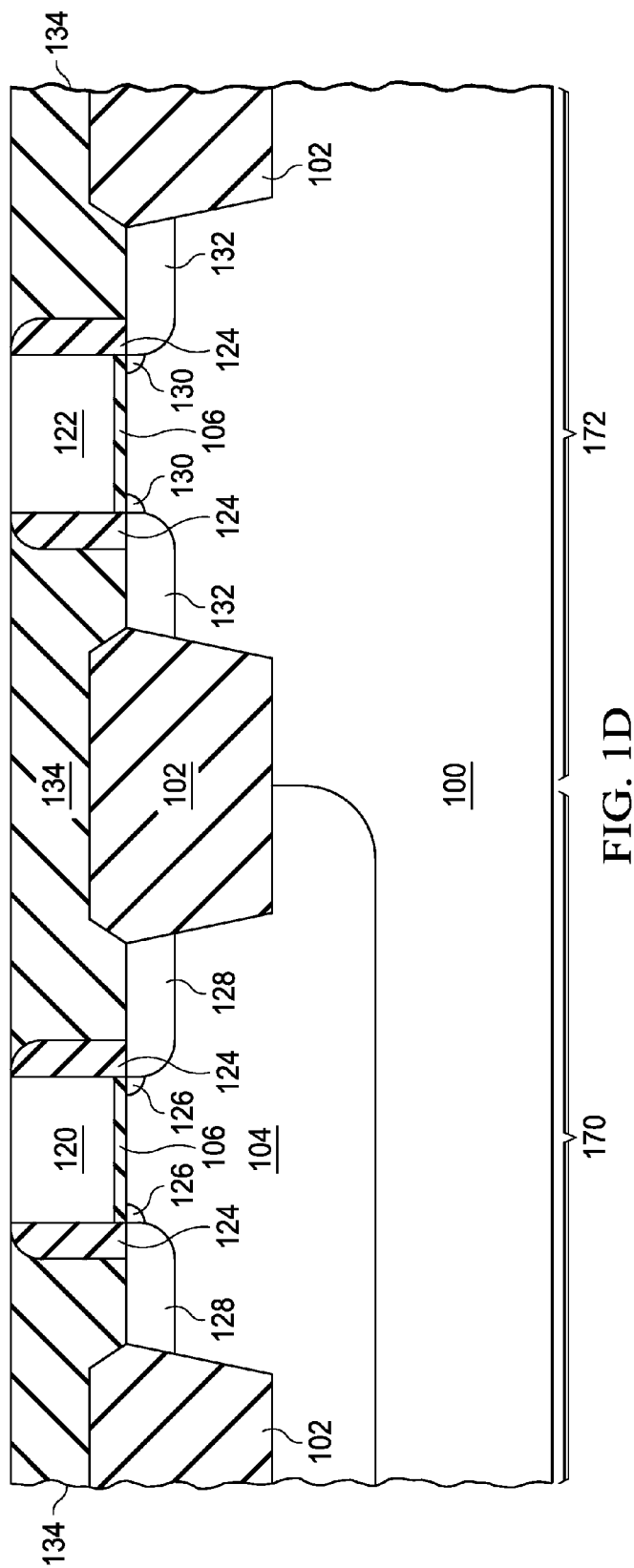
Figure 1E:
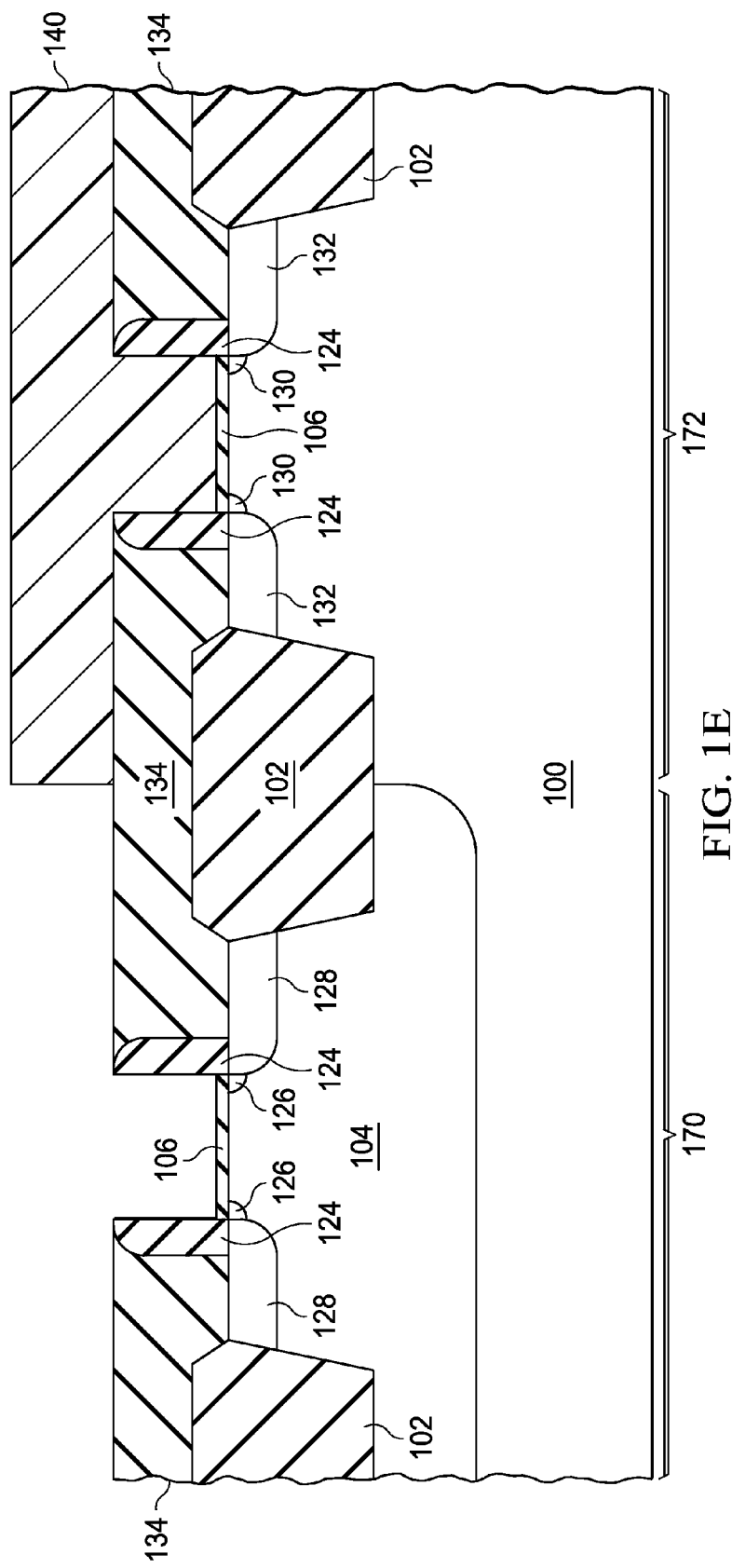
Figure 1F:
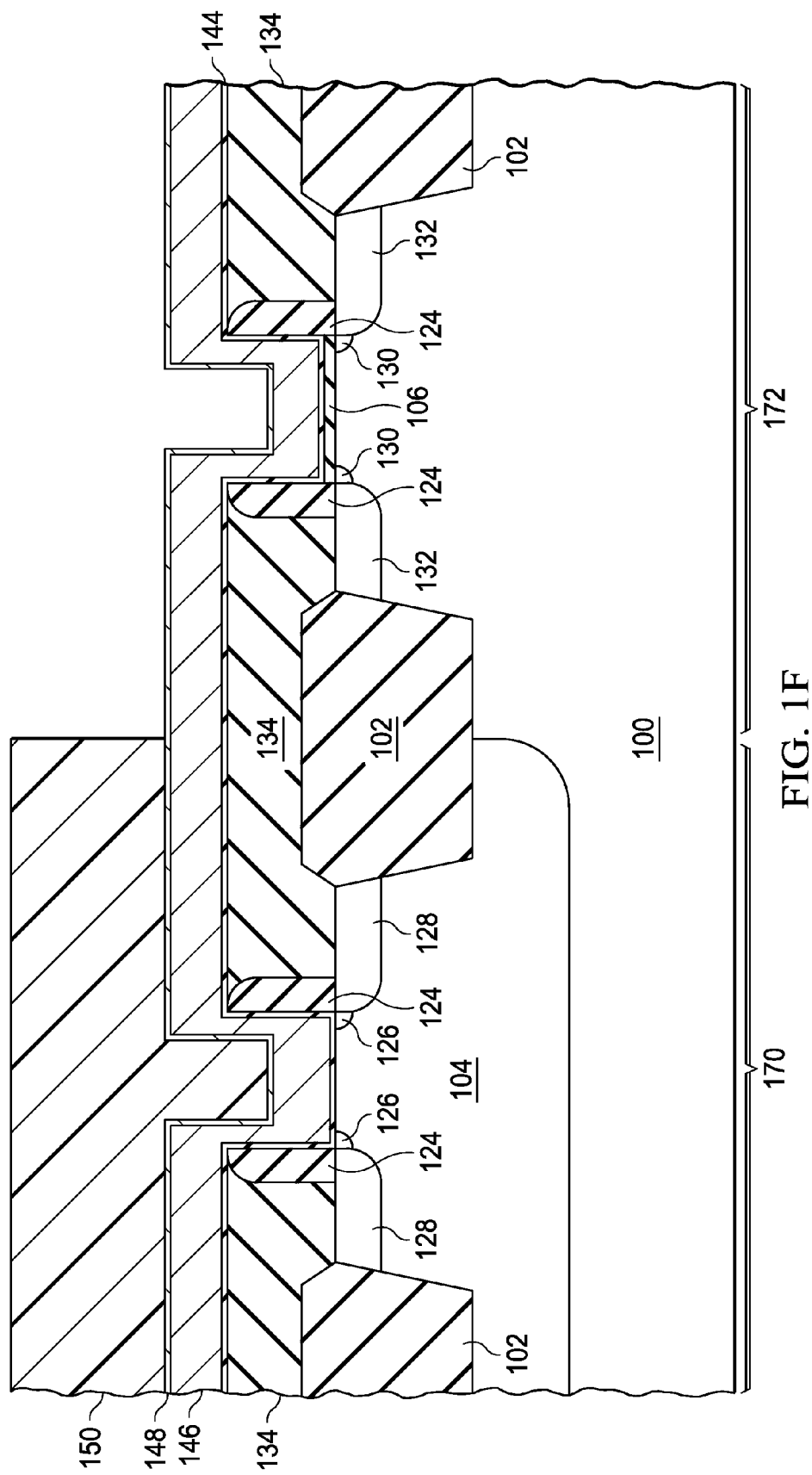
Figure 1G:
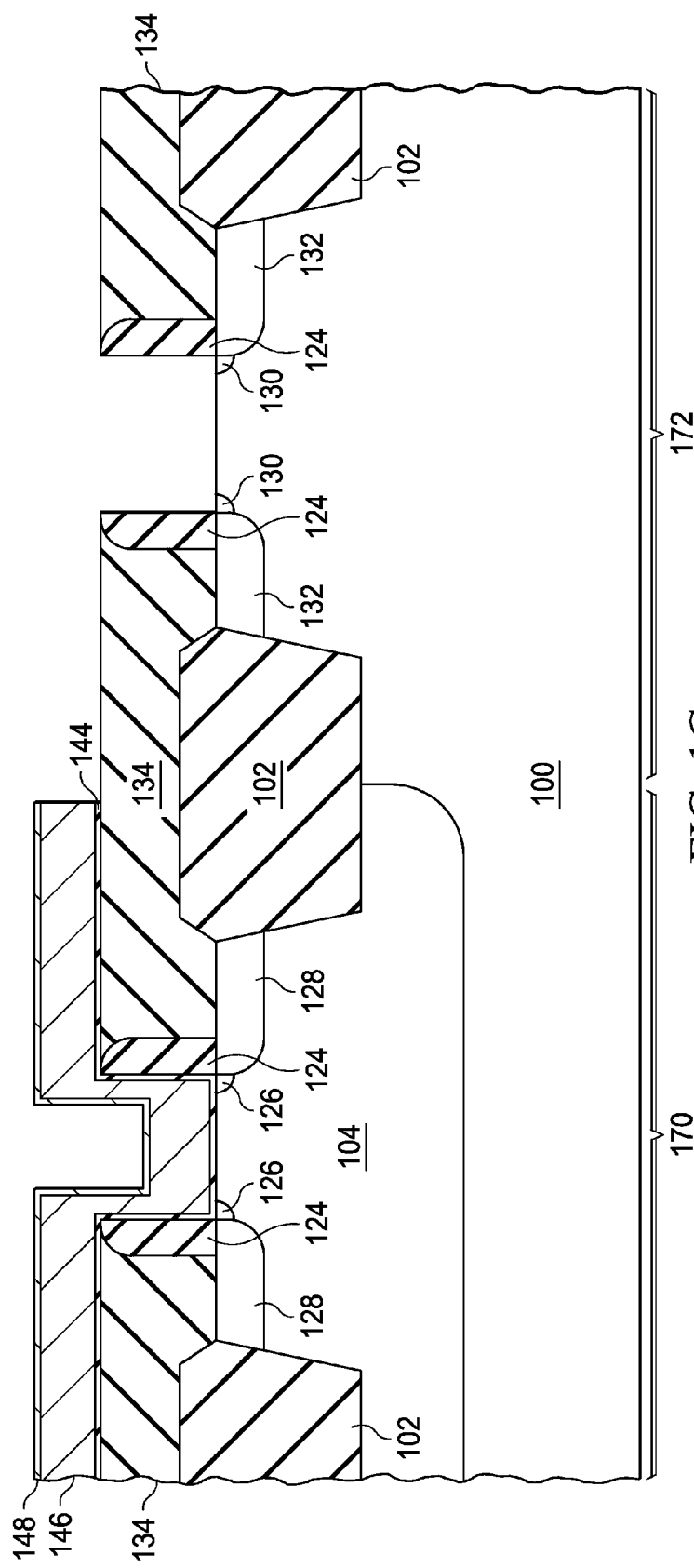
Figure 1H:
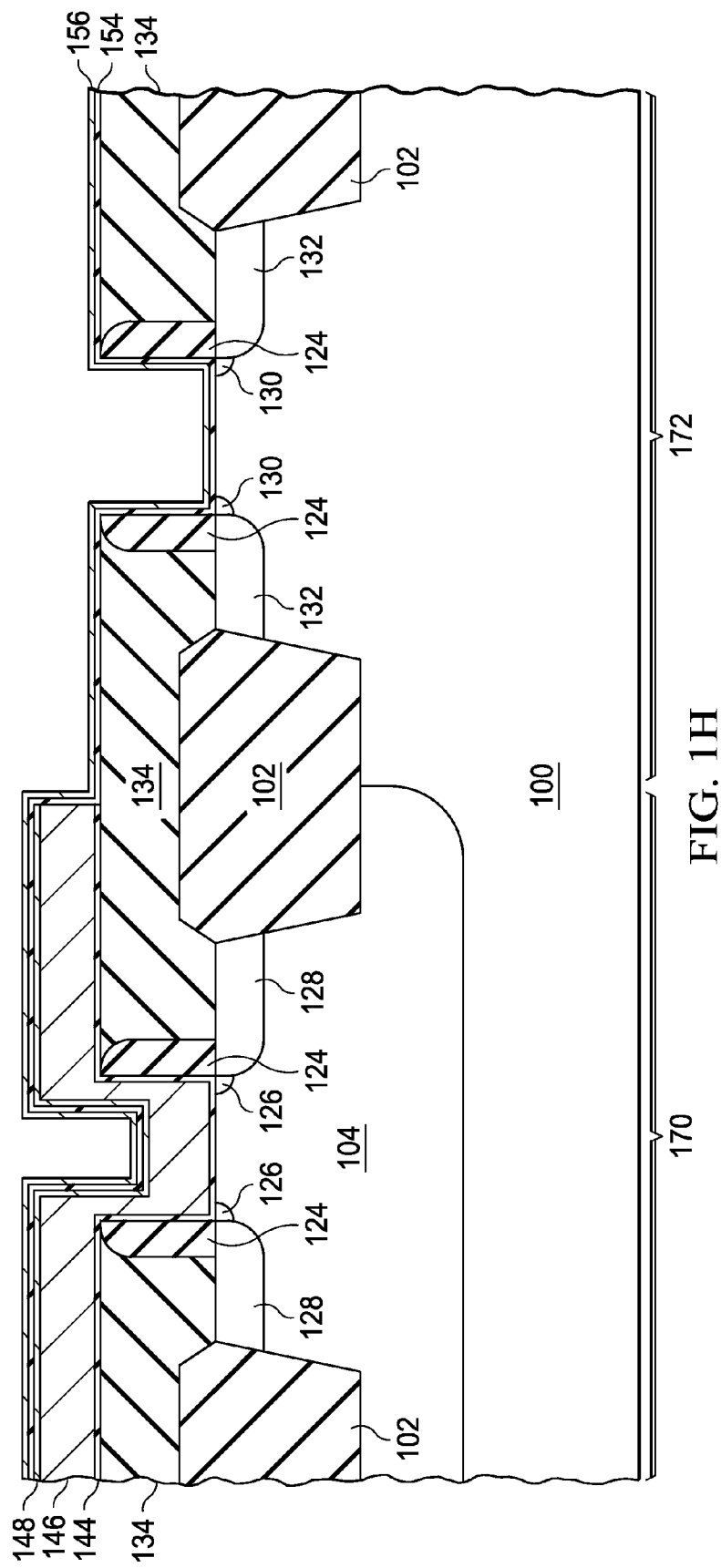
Figure 1I:
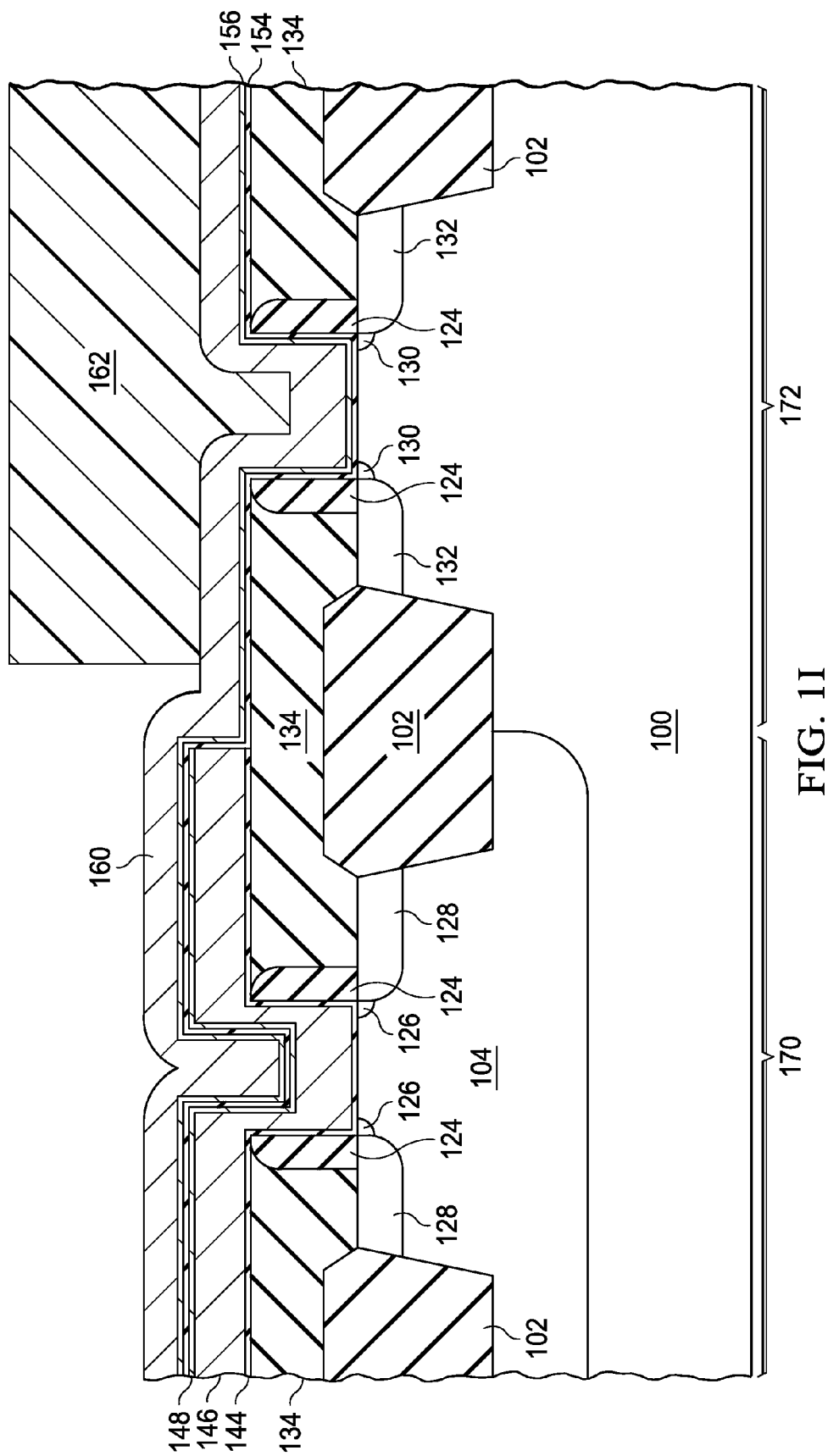
Figure 1J:
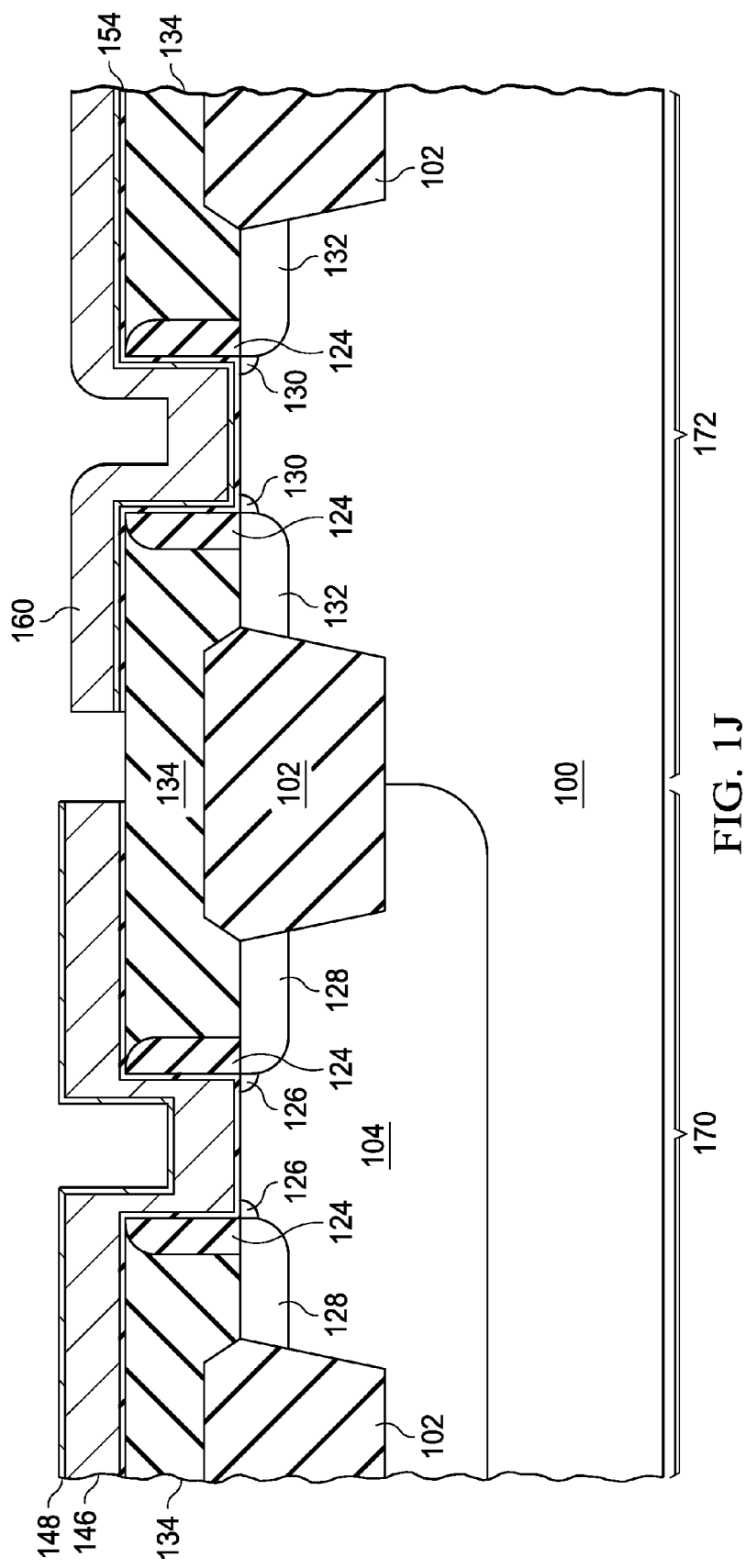
Figure 1K:
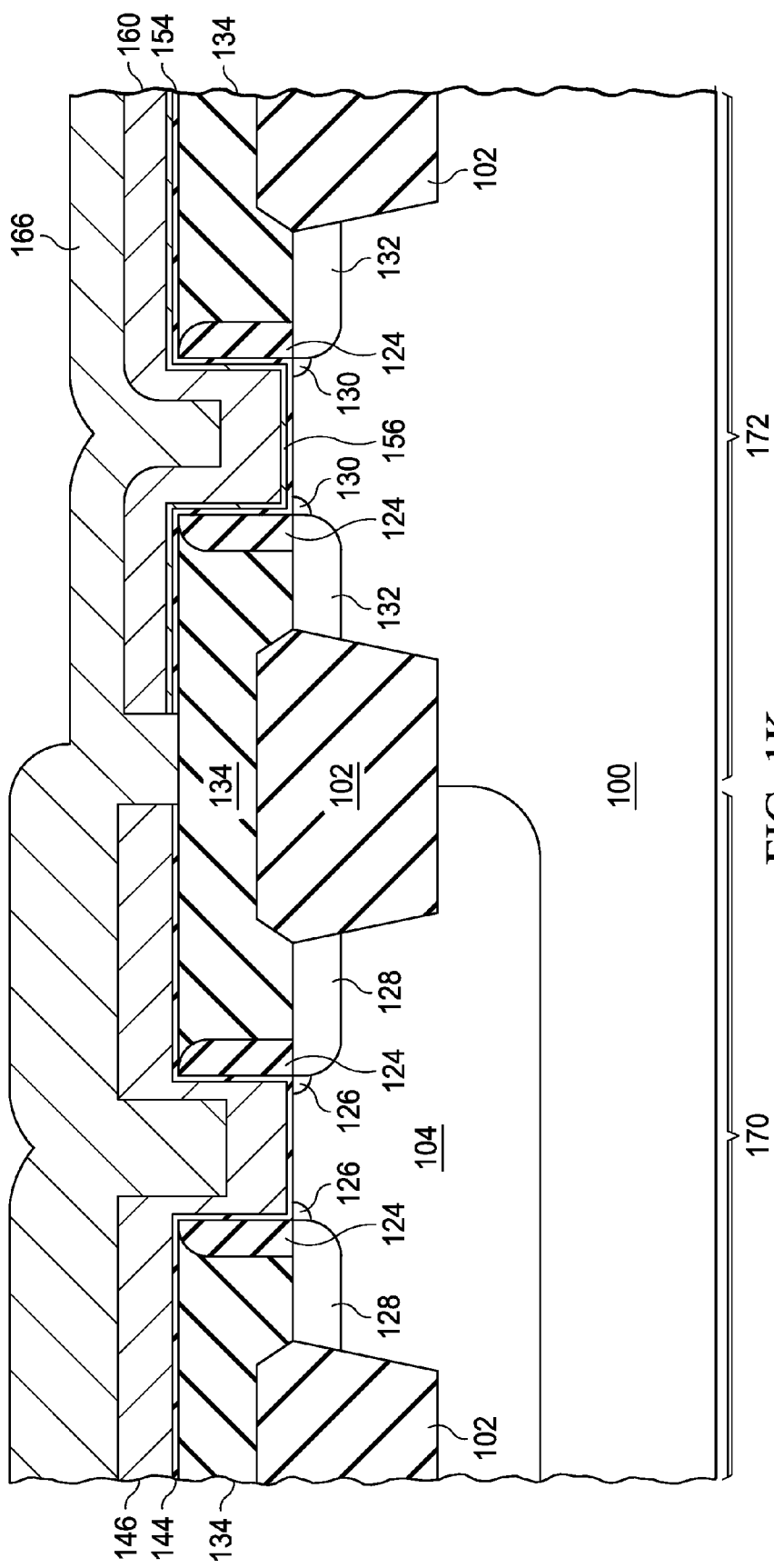
Figure 1L:
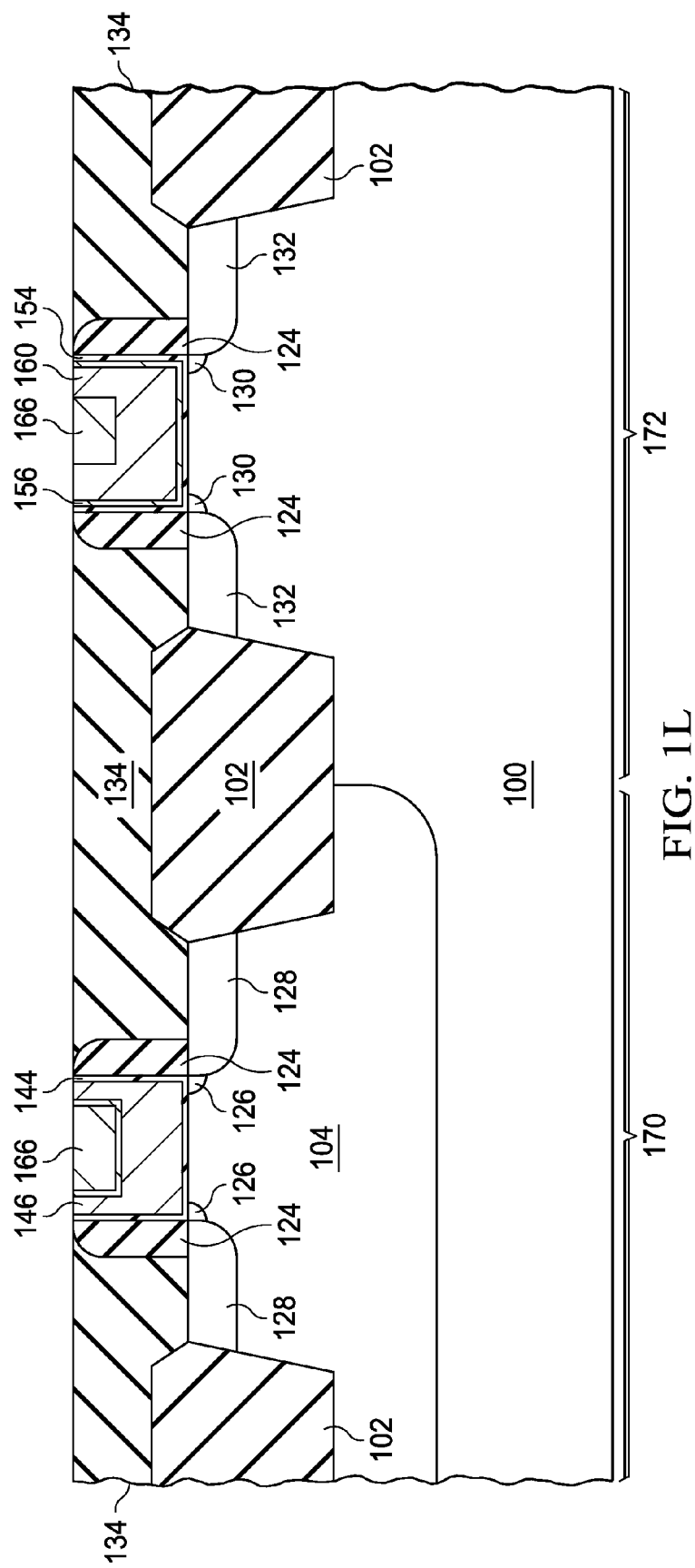

High-k last, metal gate CMOS transistors formed according to a 3 pattern embodiment replacement gate process are shown in FIG. 1L. PMOS transistor 170 has high-k dielectric 144 and PMOS TiN gate 146. The thickness and oxygen content of the PMOS TiN metal gate 146 is optimized to give a workfunction greater than about 4.85 eV. NMOS transistor 172 has high-k dielectric, 154, and NMOS TiN gate 156. The thickness and oxygen content of the NMOS TiN metal gate is optimized to give a workfunction less than about 4.25 eV. Fill metal, 160 and 166, such as tungsten or aluminum is deposited on the NMOS and PMOS TiN gates within the replacement gate trenches to fill the trenches. The overfill is then removed using chemical mechanical polish (CMP) planarization.

The major steps in the formation of an embodiment 3 pattern high-k last, replacement metal gate transistors are illustrated in FIG. 1A through 1L. Three photo resist patterning steps are used in this three pattern high-k last, replacement metal gate process flow.

The partially processed integrated circuit in FIG. 1A is formed on a p-type substrate 100. Shallow trench isolation (STI) dielectric geometries 102 electrically isolate transistors and other devices on the integrated circuit. A sacrificial silicon dioxide film 106 with a thickness in the range of approximately 10 nm to 40 nm is grown on the integrated circuit substrate 100. An nwell 104 is formed in the region where the PMOS transistor 170 is to be formed. An NMOS transistor 172 is formed in the p-type substrate region of the integrated circuit substrate 100.

Referring now to FIG. 1B polysilicon gate material 110 is deposited on the sacrificial silicon dioxide film 106. A transistor gate photo resist pattern 112 is formed on the polysilicon gate material 110.

The cross section in FIG. 1C is shown after the gates 120 and 122 are etched, gate extension diffusions, 126 and 130, are formed, dielectric sidewalls 124 are formed, and the deep source and drain diffusions 128 and 132 are formed. Other processing steps such as silicide formation on the source and drains and stress enhancement of the transistors are omitted for clarity. Pre-metal dielectric (PMD) 134 which may be comprised of several dielectric layers such as stress dielectric, gap fill dielectric, and other deposited dielectrics is then deposited to a thickness that is at least the height of the transistor gates 120 and 122.

As shown in FIG. 1D, in a high-k last, replacement gate metal gate process, the PMD dielectric 134 is planarized to expose the tops of the polysilicon transistor gates 120 and 122.

In FIG. 1E the polysilicon replacement gates 120 and 122 are removed by a polysilicon wet etch. A first PMOS replacement gate pattern 140 is formed to protect the silicon dioxide dielectric 106 in the bottom of the NMOS 172 replacement gate transistor trench and to expose the silicon dielectric 106 in the bottom of the PMOS 170 replacement gate transistor trench.

Referring now to FIG. 1F, the silicon dioxide dielectric 106 is removed from the PMOS 170 transistor trench and the first PMOS replacement gate pattern 140 is removed. High-k gate dielectric 144 such as $HfO_x$, $HfSiO_x$, or HfSiON is deposited into the PMOS replacement gate transistor trench 170, and a PMOS TiN metal gate film 146 is deposited on the high-k gate dielectric 144. The high-k gate dielectric 144 film is deposited using atomic layer deposition (ALD) with a thickness that is typically between about 1 and 4 nm. The PMOS TiN metal gate film 146 is deposited with a thickness greater than about 8 nm. A TaN film 148 which is used as an etch stop for the high-k dielectric etch is deposited on the TiN 146 with a thickness of about 2 nm or more. In an example embodiment integrated circuit, the high-k dielectric is 1.2 nm $HfO_x$, the PMOS TiN film 146 is 10 nm, and the TaN film 148 is 2 nm.

The PMOS TiN metal gate 146 then annealed in oxygen as described in U.S. Pat. No. 8,643,113 hereby incorporated for reference to provide a workfunction above 4.85 eV.

An NMOS 172 replacement gate transistor photo resist pattern 150 is formed to protect the PMOS TiN gate over the PMOS transistor 170 and to enable the TaN 148 and TiN 146 to be removed from the NMOS area 172.

As shown in FIG. 1G the TaN film 148, the PMOS TiN gate material 146, and the high-k gate dielectric 144 are removed from the NMOS 172 replacement gate transistor trench. The silicon dioxide dielectric 106 film is also removed.

NMOS high-k dielectric 154 such as $HfO_x$, $HfSiO_x$, or HfSiON is then deposited into the NMOS replacement gate transistor trench as shown in FIG. 1H. Typically the high-k dielectric is deposited to a thickness between about 1 nm and 4 nm. NMOS TiN metal gate material 156 with a thickness in the range of about 1 nm to 3 nm is deposited on the high-k dielectric 154. In an example embodiment the high-k dielectric is $HfO_2$ about 1.2 nm thick and is deposited using atomic layer deposition (ALD). As described in U.S. Pat. No. 8,643, 113 hereby incorporated by reference, the oxygen content in the NMOS TiN metal gate material 156 is less than about $1 \times 10^{13}$ atoms/cm$^3$ within one nanometer of the top surface of the high-k gate dielectric 154 to provide a workfunction less than about 4.25 eV. In an example embodiment, 2 nm of the NMOS TiN metal gate material 156 is deposited using ALD.

In FIG. 1I a CVD-W (chemical vapor deposition—tungsten) film 160 is deposited on the NMOS TiN gate material 156 and a second PMOS replacement gate transistor pattern 162 is formed on the CVD-W film 160 to protect it over the NMOS replacement gate transistor 172 and to enable the CVD-W film 160, the NMOS TiN gate material 156 and the NMOS high-k dielectric 154 to be etched from the PMOS 170 replacement gate transistor region.

FIG. 1J shows the integrated circuit after the CVD-W film 160, the thin NMOS TiN gate material 156, and the NMOS high-k gate dielectric 154 are etched from the PMOS 170 replacement gate transistor region. The TaN film 148 serves and an etch stop for the high-k dielectric 154 etch. After the NMOS transistor 172 high-k gate dielectric 154 is removed from the PMOS 170 replacement gate transistor region, the TaN etch stop film 148 may be removed by etching. The NMOS 172 transistor high-k gate dielectric 154 is removed to prevent a capacitor from forming between the NMOS transistor 172 TiN metal gate material 156 and the PMOS transistor 170 TiN metal gate material 146.

As shown in FIG. 1K additional CVD-W 166 is deposited to completely fill the PMOS 170 and NMOS 172 replacement gate transistor trenches. Aluminum metal alternatively may be used.

The CVD-W overfill and the metal gate material is then removed from the surface of the PMD dielectric 134 between the replacement gate transistor trenches 170 and 172 using CMP shown in FIG. 1L. The replacement gate PMOS 170 transistor has a thick oxygenated TiN metal gate with a workfunction above about 4.85 eV. The replacement gate NMOS 172 transistor has a thin deoxygenated NMOS TiN metal gate with a workfunction less than about 4.25 eV.

Additional PMD dielectric may be deposited on the integrated circuit and contacts may be formed to the transistor gates and to deep source and drain diffusions to electrically connect them to a first layer of interconnect. Additional layers of dielectric and more levels of interconnect may be formed to complete the integrated circuit.

The advantages of the embodiment 3 pattern high-k last replacement metal gate process is that the PMOS and NMOS high-k dielectrics are deposited immediately before the PMOS and NMOS TiN metal gates are deposited. There is no degradation of the high-k dielectric due to layers being chemically stripped off prior to the TiN metal gate deposition. In addition the high-k dielectric for NMOS is deposited using a different process step than the high-k dielectric for the PMOS so if desired different high-k dielectrics may be used on the NMOS and PMOS transistors.

Figure 2A:
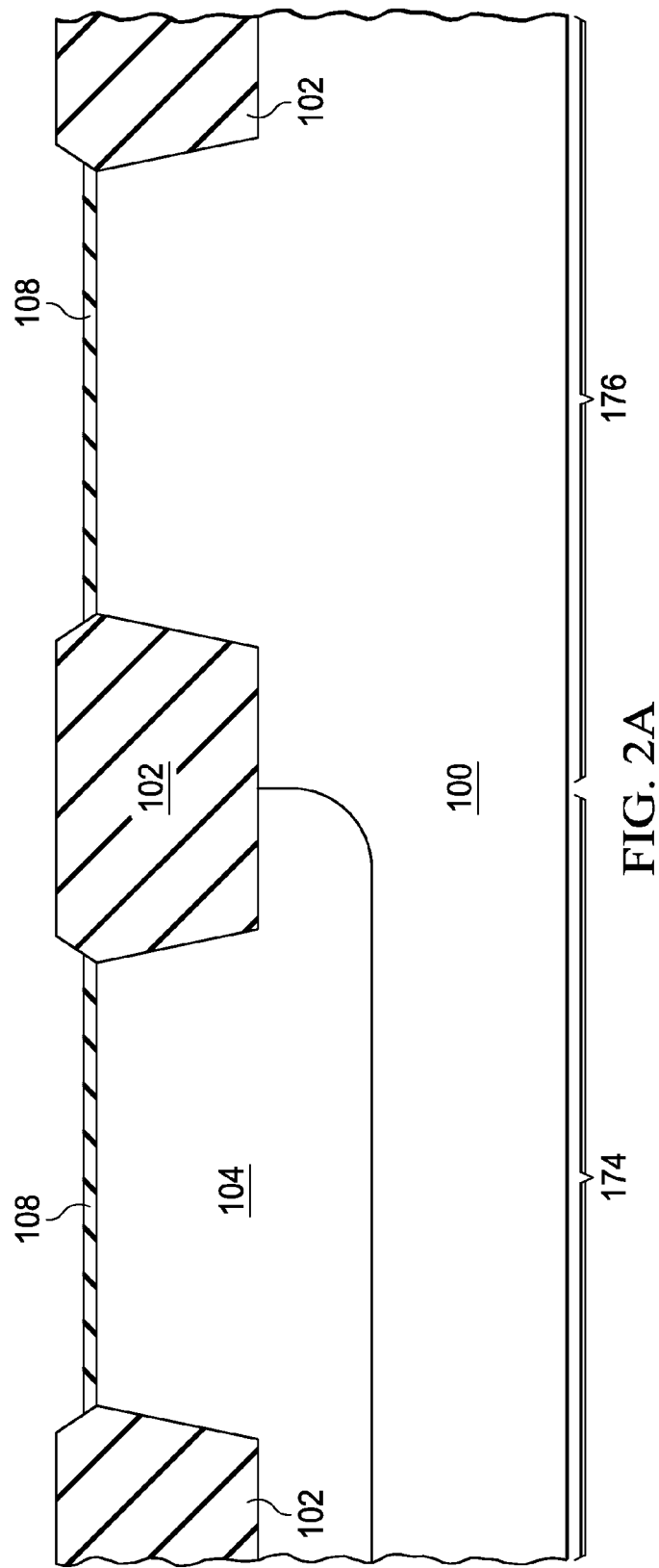
FIGS. 2A-2J are illustrations of steps in the fabrication of integrated circuits with high-k first, replacement metal gate CMOS transistors formed according to principles of the invention.
Figure 2B:
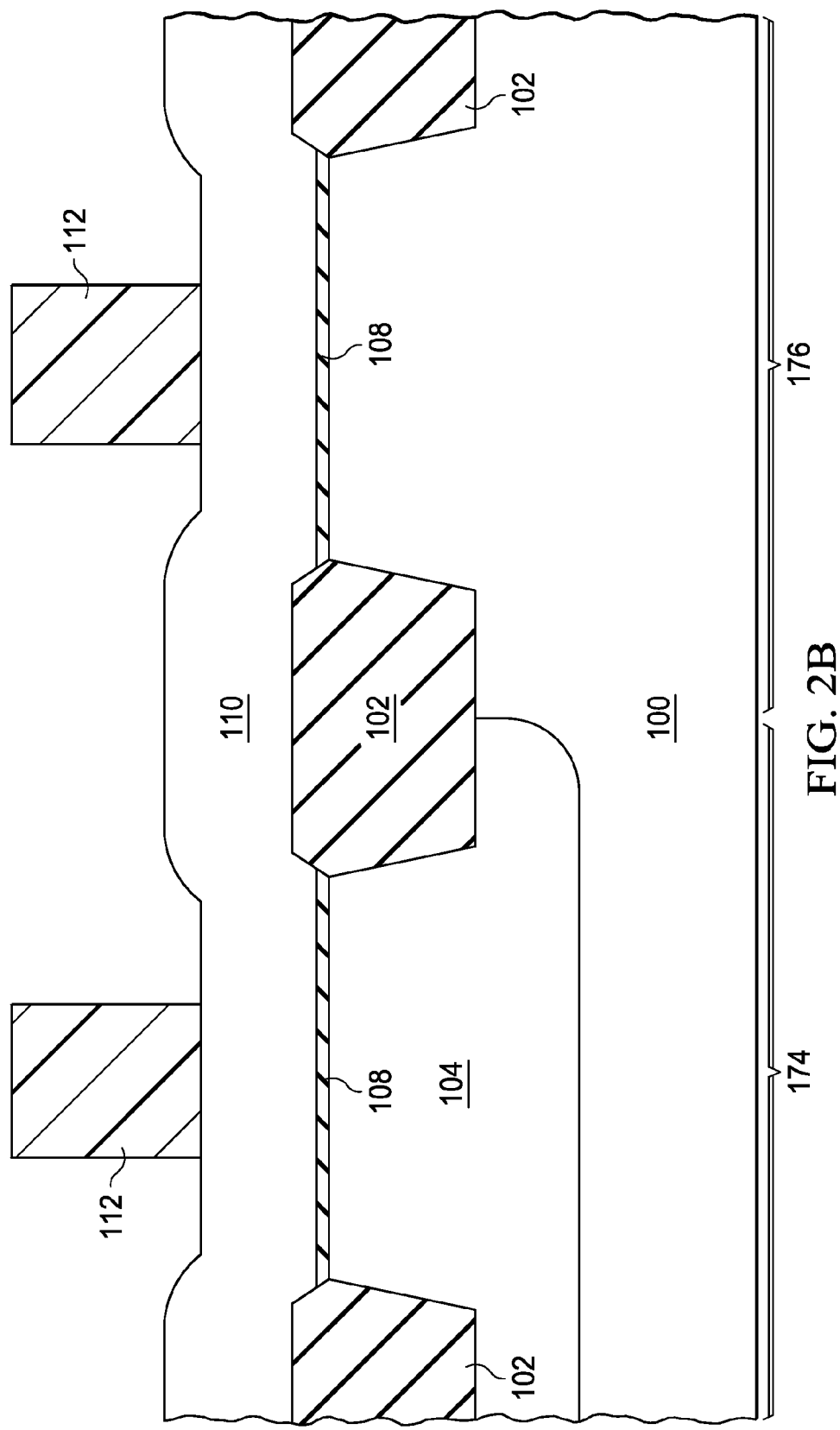
Figure 2C:
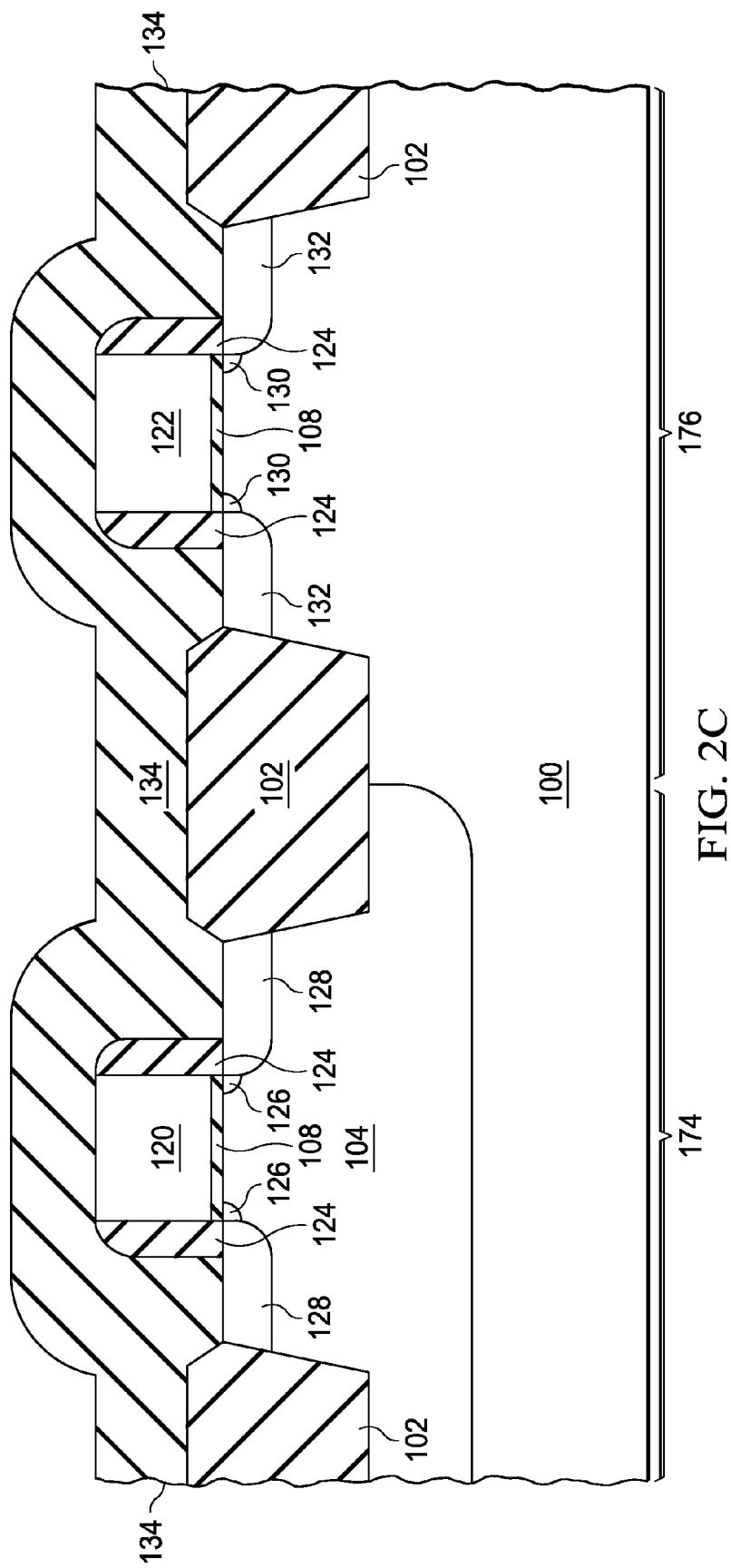
Figure 2D:
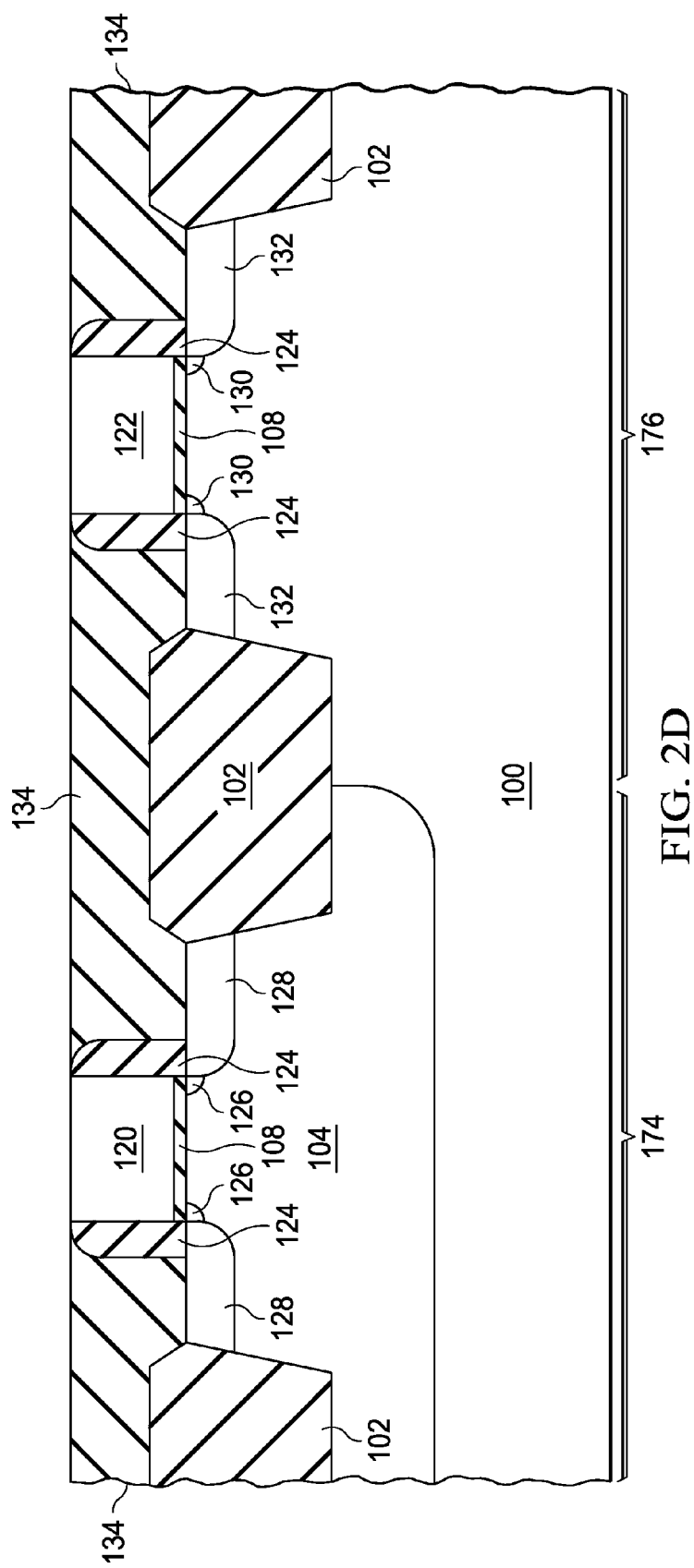
Figure 2E:
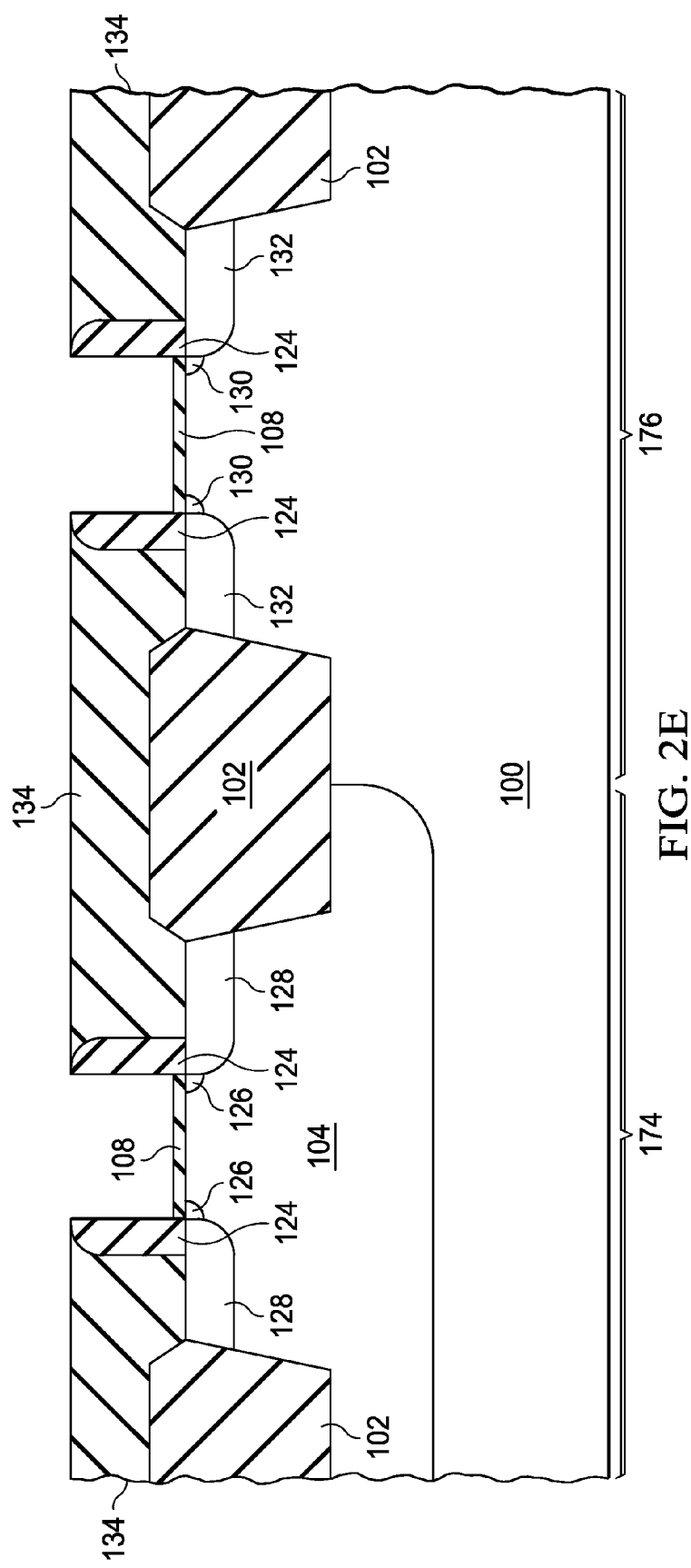
Figure 2F:
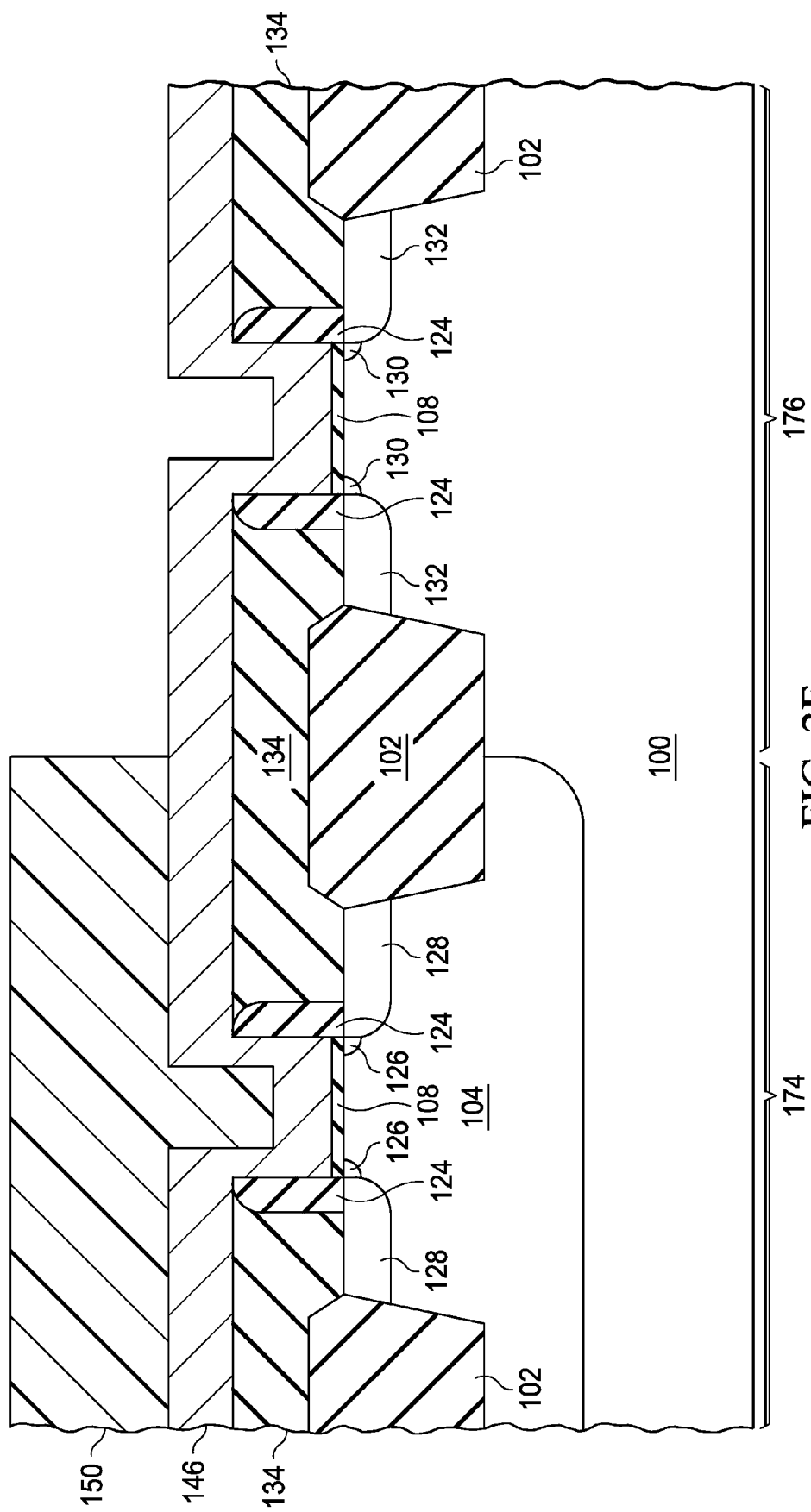
Figure 2G:
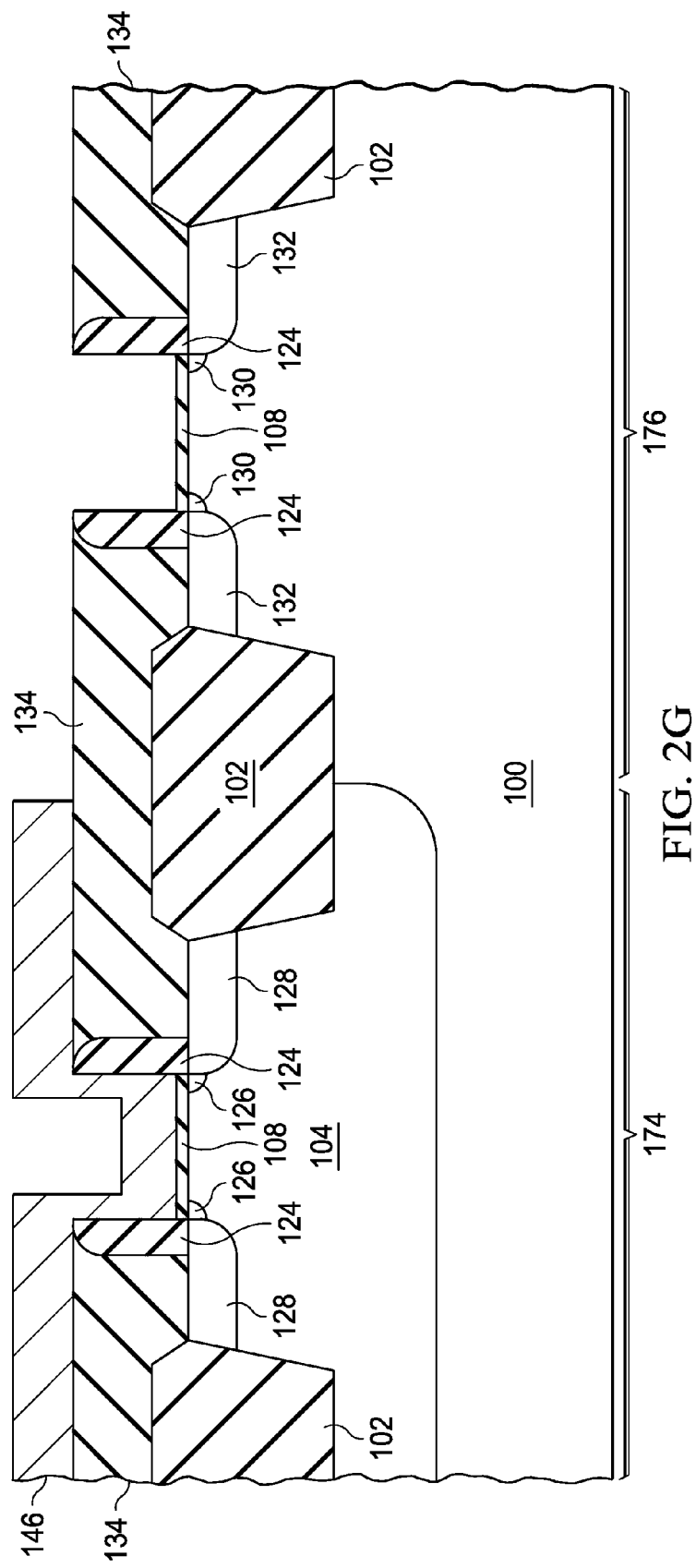
Figure 2H:
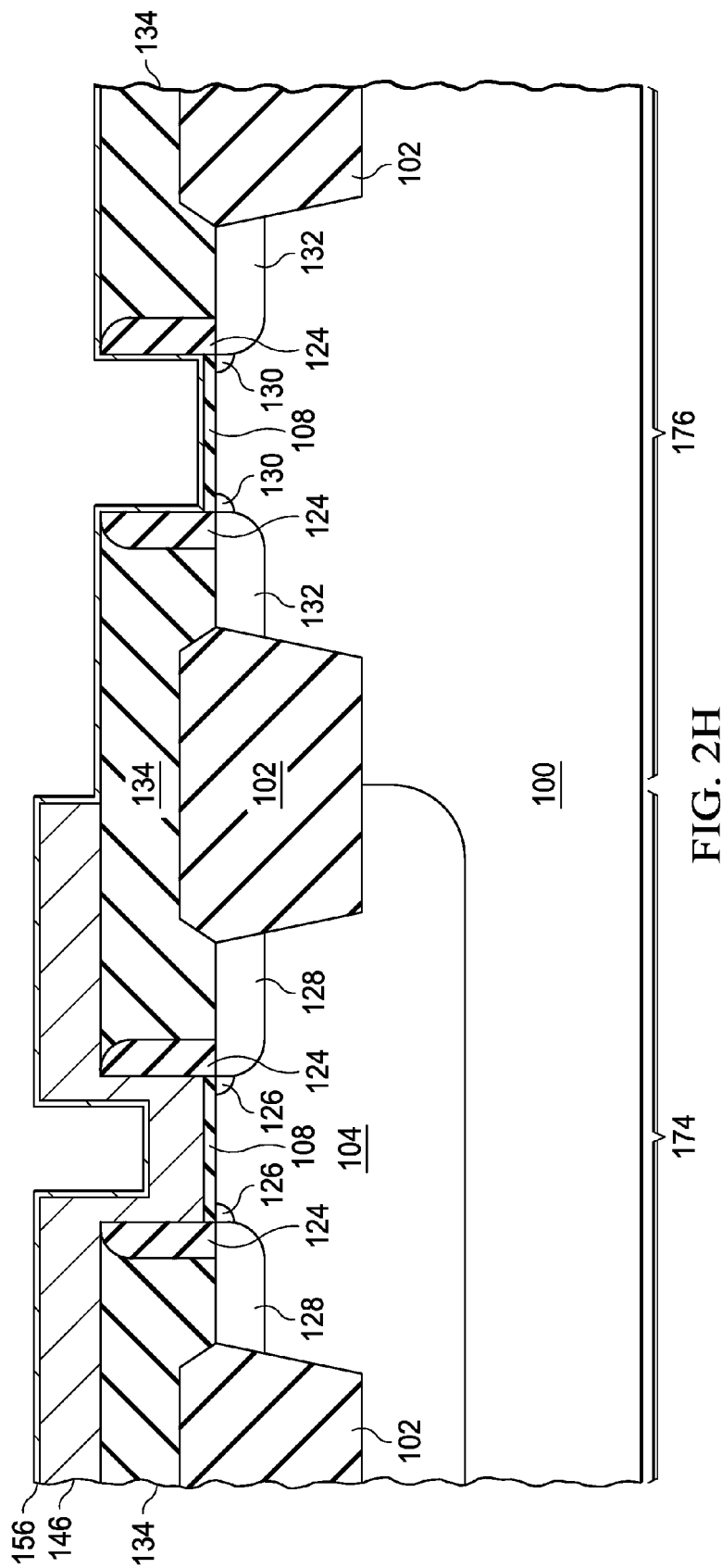
Figure 2I:
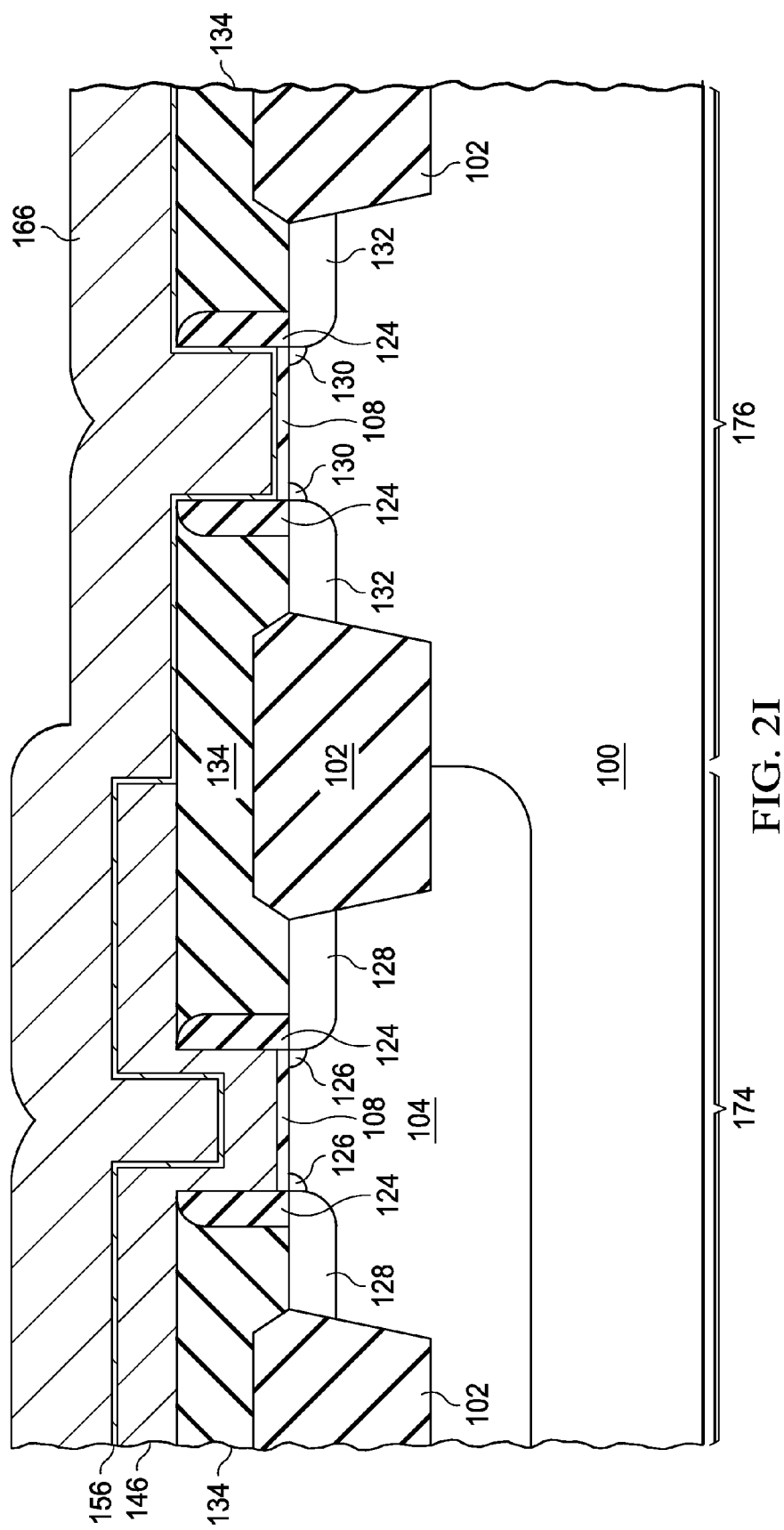
Figure 2J:
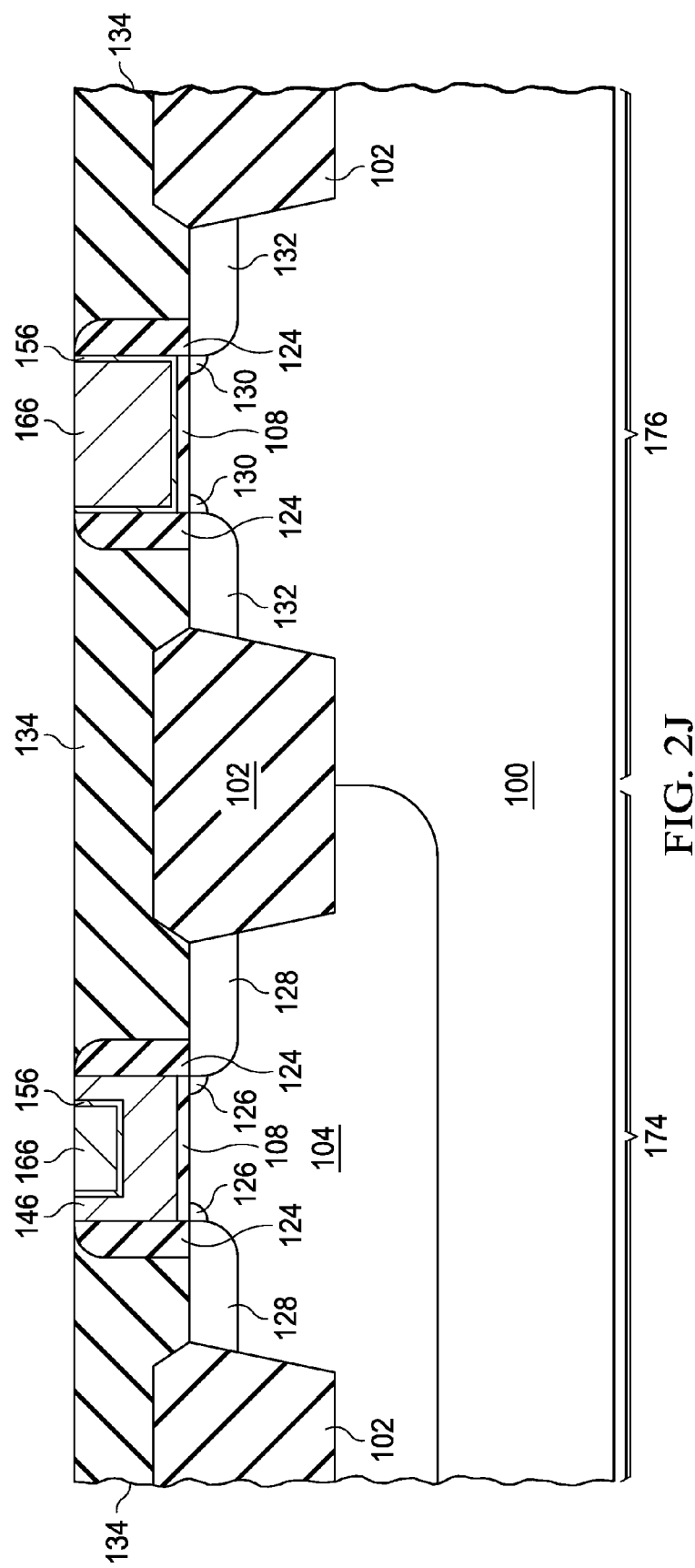

High-k first, metal gate CMOS transistors formed according to a 1 pattern embodiment replacement gate process are shown in FIG. 2J. PMOS transistor 174 has high-k dielectric 144 and PMOS TiN gate 146. The thickness and oxygen content of the PMOS TiN metal gate 146 is optimized to give a workfunction greater than about 4.85 eV. NMOS transistor 176 has high-k dielectric 108, and NMOS TiN gate 156. The thickness and oxygen content of the NMOS TiN metal gate is optimized to give a workfunction less than about 4.25 eV. Metal 166 such as tungsten or aluminum is deposited on the NMOS and PMOS TiN gates within the replacement gate trenches and planarized.

The major steps in an embodiment 1 pattern high-k first, replacement metal gate CMOS process flow using an embodiment one photo resist pattern process are illustrated in FIG. 2A through 2J. This embodiment process has the advantage of being less expensive to implement than the previously described three photo resist pattern embodiment process.

The partially processed integrated circuit in FIG. 2A is formed on a p-type substrate 100. Shallow trench isolation (STI) dielectric geometries 102 electrically isolate transistors and other devices on the integrated circuit. An nwell 104 is formed in the region where the PMOS transistor 174 is to be formed. An NMOS transistor 176 is formed in the p-type region of the integrated circuit substrate 100.

A high-k dielectric film 108 is deposited on the integrated circuit substrate. The high-k dielectric is typically a material such as $HfO_x$, $HfSiO_x$, or HfSiON between about 1 and 4 nm thick. In an example embodiment 1 pattern high-k first metal replacement gate process, the high-k dielectric is $HfO_x$ deposited with a thickness of approximately 1.2 nm using ALD.

Referring now to FIG. 2B polysilicon gate material 110 is deposited on the high-k dielectric film 108. A transistor gate pattern 112 is formed on the polysilicon gate material 110.

The cross section in FIG. 2C is shown after the gates 120 and 122 are etched, gate extension diffusions, 126 and 130, are formed, dielectric sidewalls 124 are formed, and the deep source and drain diffusions 128 and 132 are formed. Process steps such as silicide formation on the source and drains and stress enhancement of the transistor channels are omitted for clarity. Pre metal dielectric (PMD) 134 which may be comprised of several dielectric layers such as stress dielectric, gap fill dielectric, and other deposited dielectrics is then deposited to a thickness that is at least the height of the transistor gates 120 and 122.

As shown FIG. 2D, the PMD dielectric is planarized to expose the tops of the polysilicon replacement gates 120 and 122 over the transistors.

As shown in FIG. 2E the polysilicon replacement gates, 120 and 122, are then removed exposing the high-k dielectric 108 in the bottom of the replacement gate transistor trenches 174 and 176.

Referring now to FIG. 2F, a PMOS TiN metal gate film 146 is deposited on the high-k gate dielectric 108. The PMOS TiN metal gate film 146 is deposited with a thickness greater than about 8 nm. In an example embodiment integrated circuit, the PMOS TiN metal gate film is about 10 nm.

The PMOS TiN metal gate then annealed in oxygen as described in U.S. Pat. No. 8,643,113 hereby incorporated for reference to provide a workfunction above 4.85 eV.

An NMOS replacement gate 174 photo resist pattern 150 is formed to protect the PMOS TiN gate 146 over the PMOS transistor 174 and to enable removal of the PMOS TiN gate 146 from the NMOS replacement gate transistor area 176.

As shown in FIG. 2G the PMOS TiN metal gate material 146 is removed from the NMOS 176 replacement gate transistor area. A highly selective etch is used to remove the PMOS TiN metal gate material 146 from the high-k gate dielectric 108 in the NMOS transistor 176 region so as not to damage the high-k gate dielectric 108. In an example embodiment a wet etch comprised of dilute SC1 plus $NH_4OH$ and $H_2O_2$ is used to remove the TiN 146 from the high-k dielectric 108.

In FIG. 2H, thin NMOS TiN metal gate material 156 is deposited on the high-k dielectric 108 in the NMOS 176 replacement gate transistor trench. As described in U.S. Pat. No. 8,643,113 hereby incorporated by reference, the oxygen content in the NMOS TiN metal gate material 156 is less than about $1 \times 10^{13}$ atoms/cm$^3$ within one nanometer of the top surface of the high-k gate dielectric 108 to provide a workfunction less than about 4.25 eV. In an example embodiment, 2 nm of the NMOS TiN metal gate material 156 is deposited using ALD.

As shown in FIG. 2I CVD-W 166 is deposited to completely fill the PMOS 174 and NMOS 176 replacement gate transistor trenches. Aluminum metal alternatively may be used.

The surface of the integrated circuit is then planarized using CMP as shown in FIG. 2J to remove CVD-W 166 overfill and metal gate material 146 and 156 from the surface of the PMD 134 between the NMOS 176 and PMOS 174 replacement gates. The high-k first replacement gate PMOS 174 transistor has a thick oxygenated TiN metal gate 146 with a workfunction greater than about 4.85 eV. The high-k first replacement gate NMOS 176 transistor has a thin deoxygenated NMOS TiN metal gate 156 with a workfunction less than about 4.25 eV.

Additional PMD dielectric may be deposited on the integrated circuit and contacts may be formed to the deep source and drain diffusions and to the transistor gates to electrically connect them to a first layer of interconnect. Additional layers of dielectric and more levels of interconnect may be formed to complete the integrated circuit.

Figure 3A:
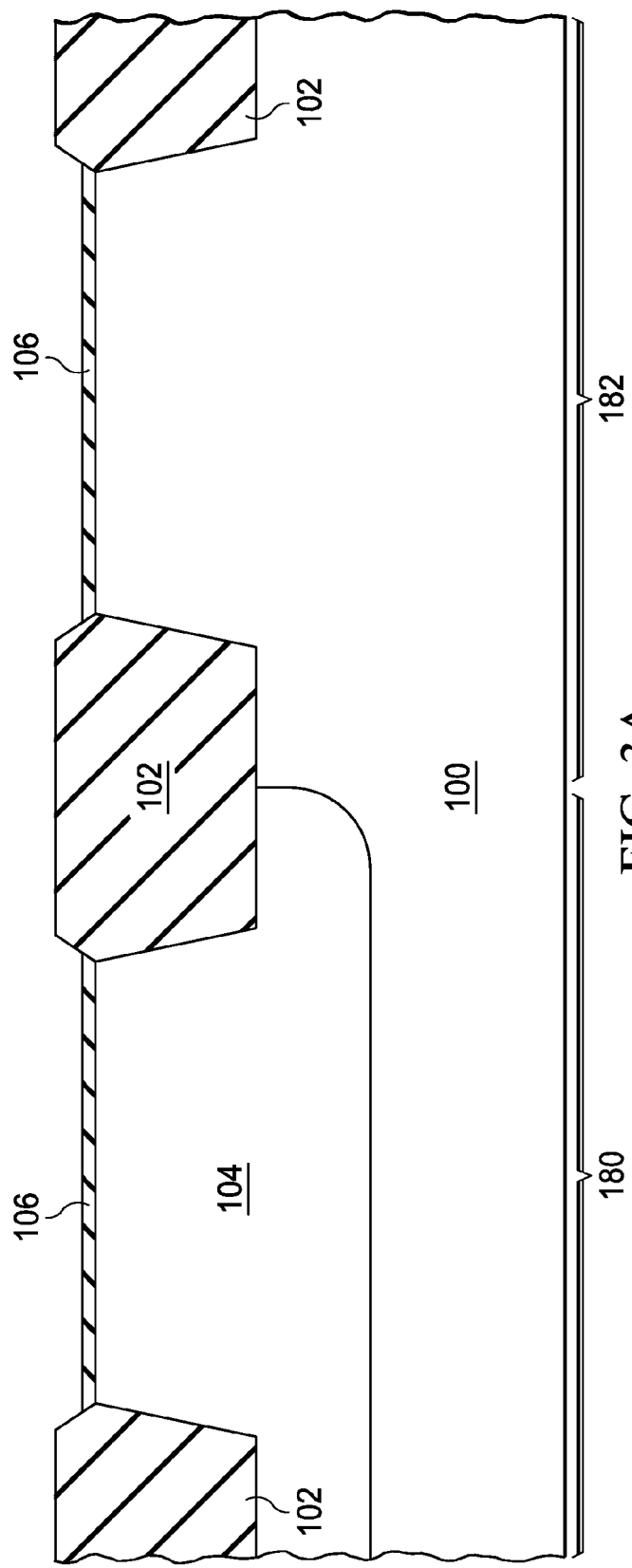
FIGS. 3A-3H are illustrations of steps in the fabrication of integrated circuits with high-k last, metal gate first CMOS transistors formed according to principles of the invention.
Figure 3B:
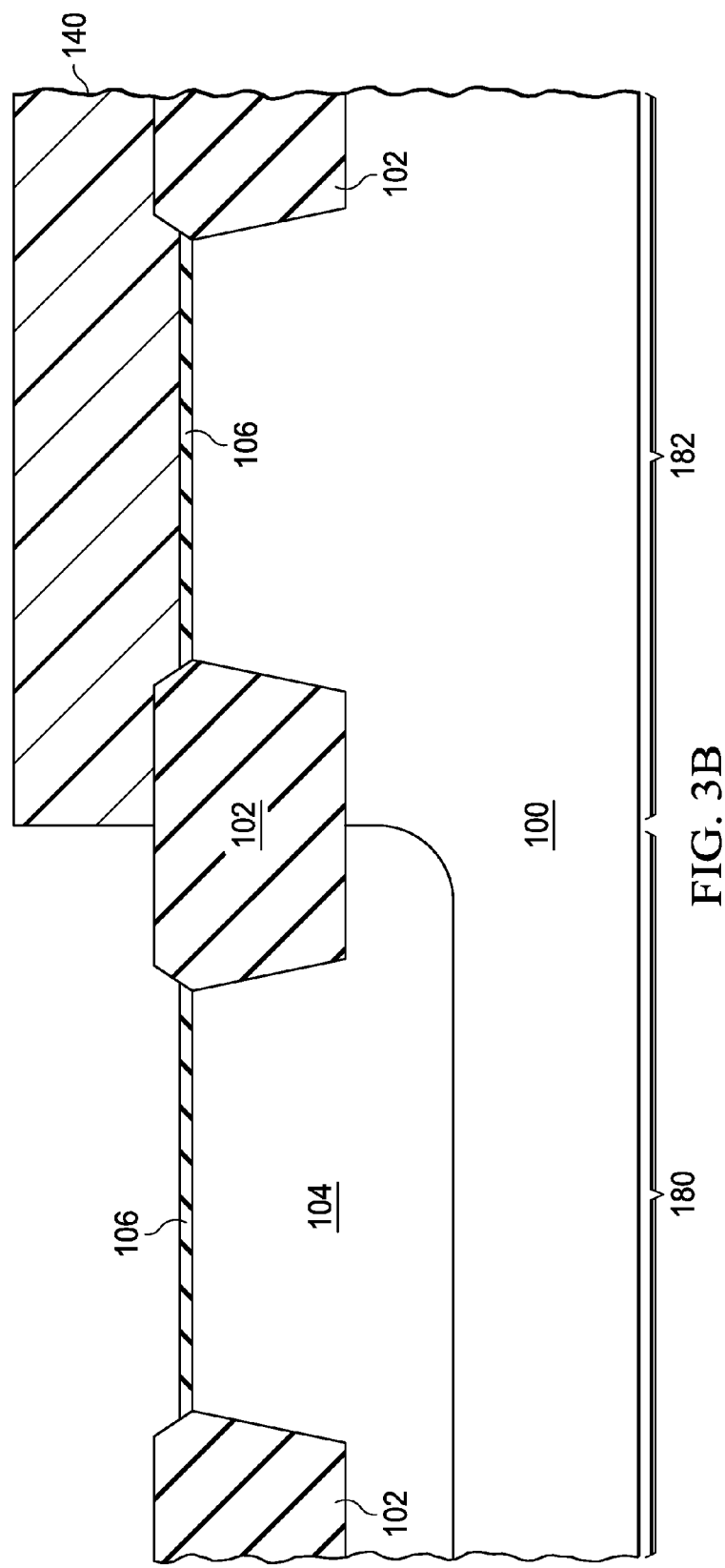
Figure 3C:
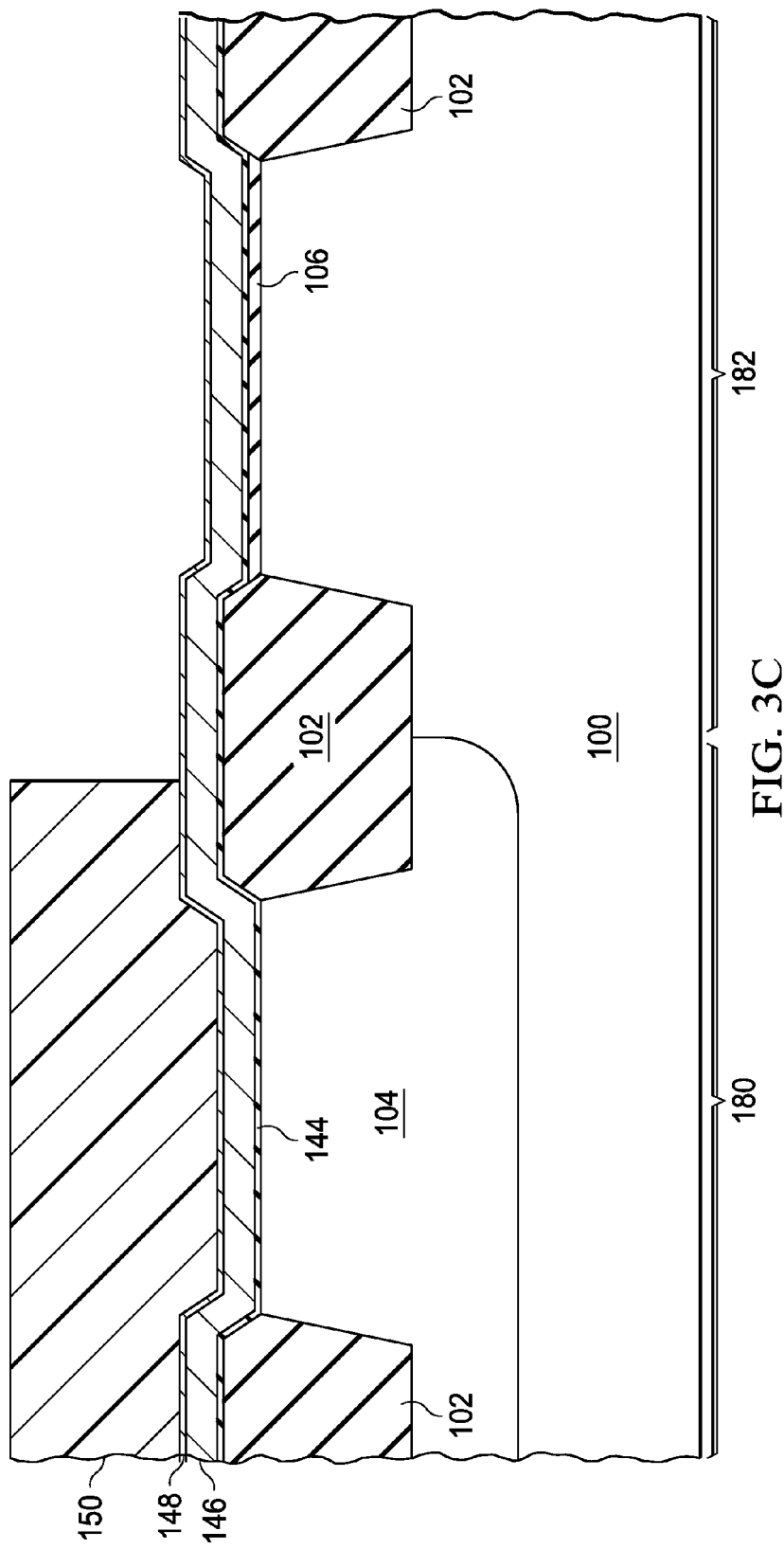
Figure 3D:
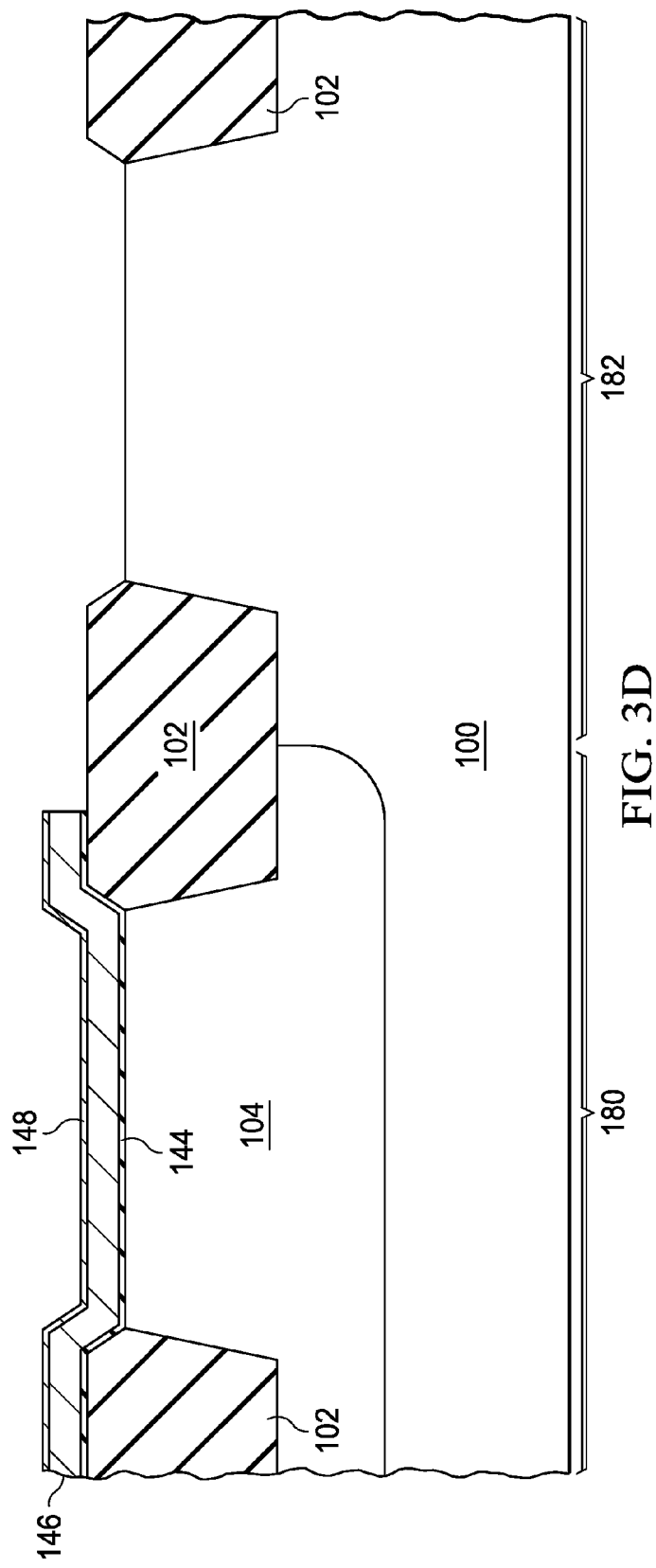
Figure 3E:
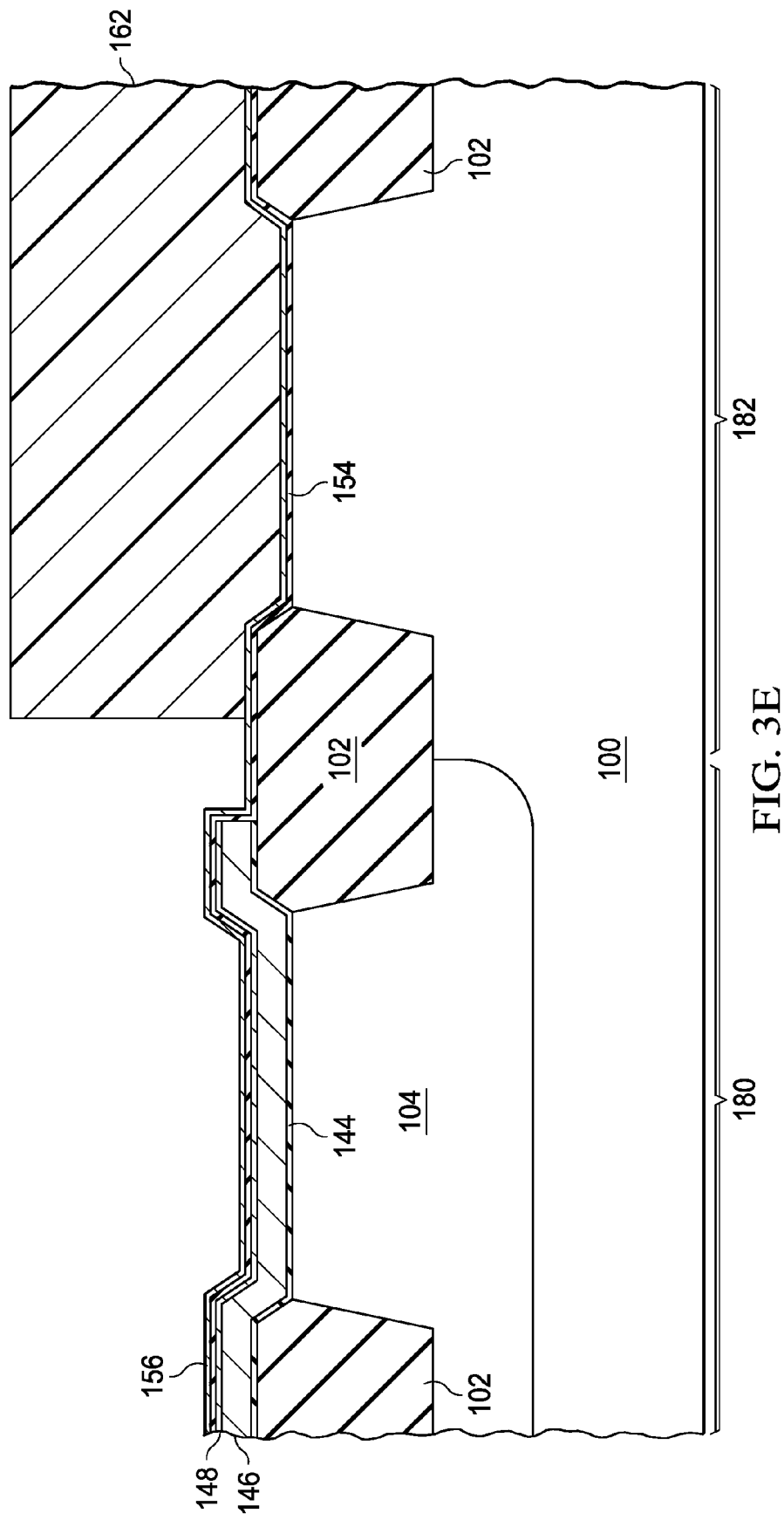
Figure 3F:
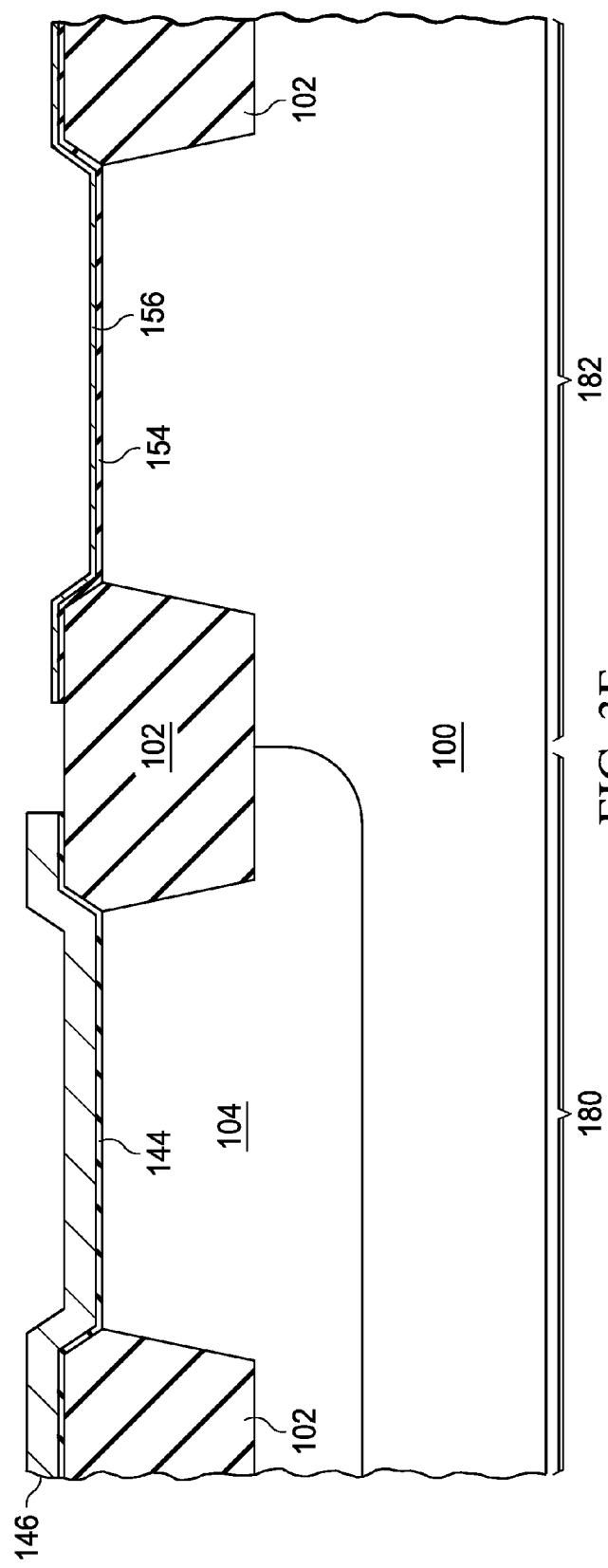
Figure 3G:
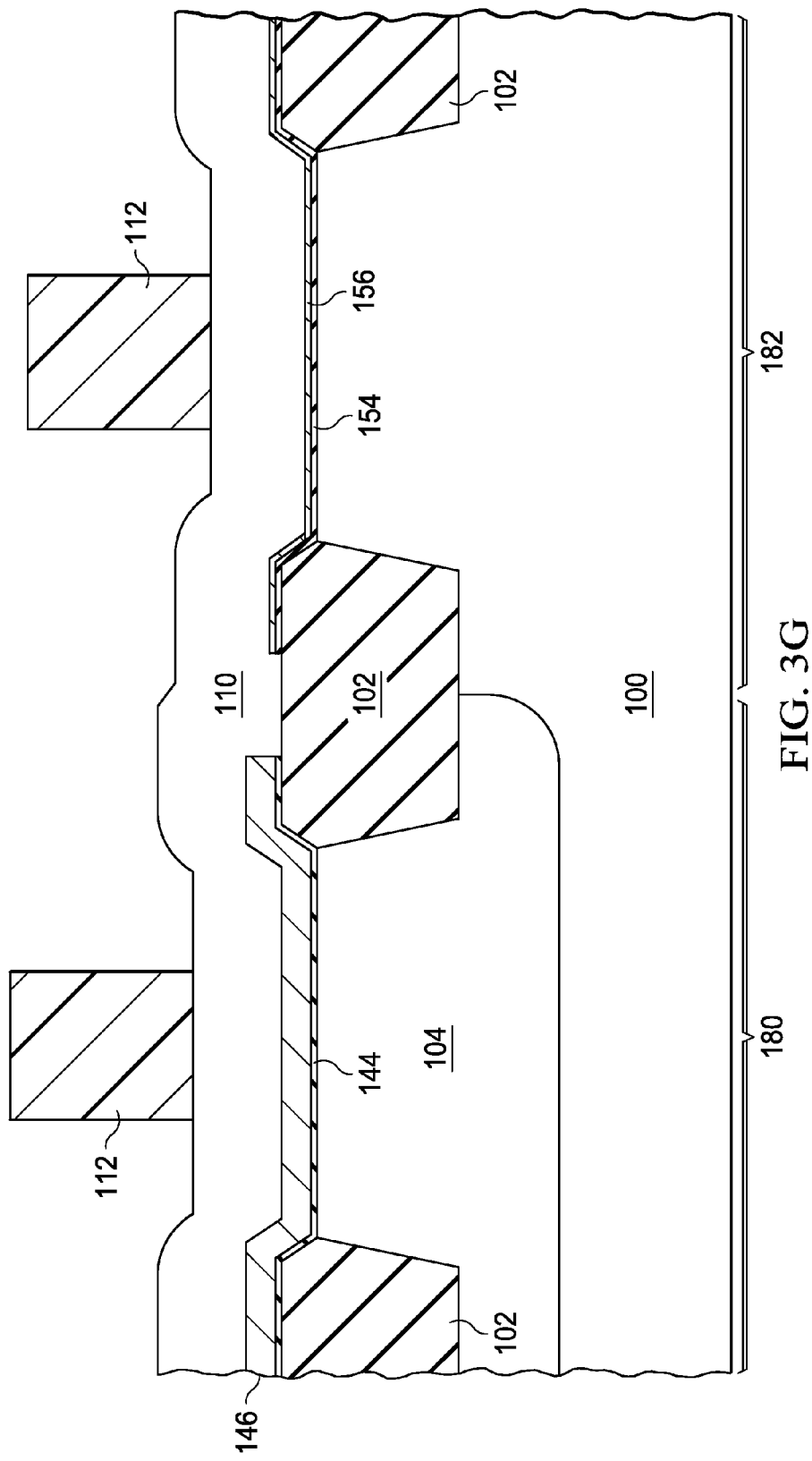
Figure 3H:
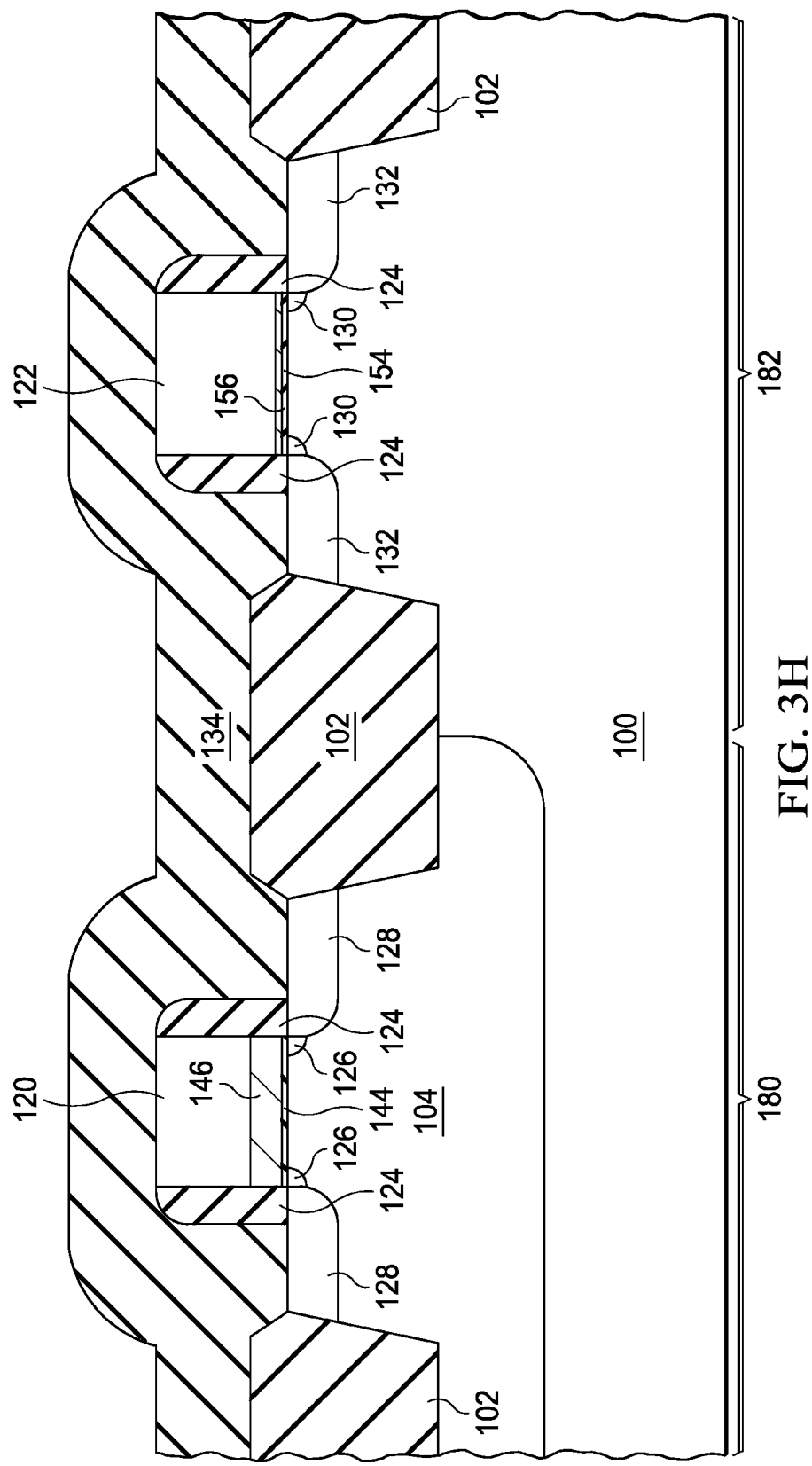

High-k last, metal gate first CMOS transistors formed according to a three pattern embodiment process are shown in FIG. 3H. PMOS transistor 180 has high-k dielectric 144 and TiN gate 146. The thickness and oxygen content of the PMOS TiN metal gate 146 are optimized to give a workfunction greater than about 4.85 eV. NMOS transistor 182 has high-k dielectric 154, and TiN gate 156. The thickness and oxygen content of the TiN NMOS metal gate 156 is optimized to give a workfunction less than about 4.25 eV. Doped polysilicon deposited on the PMOS and NMOS TiN metal gates 146 and 156 and then patterned and etched to form the gates, 120 and 122, of the embodiment high-k last, gate first NMOS and PMOS metal gate transistors 180, and 182.

The major steps in the embodiment three pattern process that forms the, high-k last, metal gate first transistors are illustrated in FIG. 3A through 3H.

The partially processed integrated circuit in FIG. 3A is formed on a p-type substrate 100. Shallow trench isolation (STI) dielectric geometries 102 electrically isolate transistors and other devices on the integrated circuit. A sacrificial silicon dioxide film 106 in the range of approximately 10 nm to 40 nm is grown on the integrated circuit substrate 100. An nwell 104 is formed in the region where the PMOS transistor 180 is to be formed by counter doping the p-type substrate 100 in the usual manner. An NMOS transistor 182 will be formed in the p-type substrate 100.

As shown in FIG. 3B a first PMOS transistor photo resist pattern 140 is formed on the sacrificial silicon dioxide layer 106 to protect it in the NMOS transistor area 182 and to allow it to be removed from the PMOS transistor area 180.

Referring now to FIG. 3C, the sacrificial silicon dioxide dielectric 106 is removed from the PMOS 180 transistor area and the first PMOS transistor photo resist pattern 140 is removed. PMOS high-k gate dielectric 144 is then deposited and a PMOS TiN metal gate film 146 is deposited on the PMOS high-k gate dielectric 144. In an example embodiment integrated circuit the high-k gate dielectric 144 film is $HfO_2$ deposited using atomic layer deposition (ALD) with a thickness of about 1.2 nm. The TiN metal gate film 146 is deposited with a thickness greater than about 8 nm. A TaN film 148 which is used as an etch stop for a high-k dielectric etch is deposited on the TiN 146 to a thickness of about 2 nm or more. In an example embodiment integrated circuit, the PMOS TiN film is 10 nm and the TaN film is 2 nm.

The PMOS TiN metal gate material 146 is then annealed in oxygen as described in U.S. Pat. No. 8,643,113 hereby incorporated for reference to provide a workfunction above 4.85 eV.

NMOS transistor photo resist pattern 150 is formed on the PMOS TiN metal gate 146 to enable the PMOS TiN metal gate material 146 to be removed from the NMOS metal gate transistor 182 area and to protect it from being removed from the PMOS metal gate transistor area 180.

FIG. 3D shows the integrated circuit after the TaN etch stop material 148 is etched, the PMOS TiN metal gate material 146 is etched, the PMOS high-k gate dielectric 144 is etched, and the sacrificial silicon dioxide film 106 is etched from the NMOS metal gate transistor 182 area.

NMOS high-k dielectric 154 is then deposited onto the integrated circuit as shown in FIG. 3E. Thin NMOS TiN metal gate material 156 is deposited on the NMOS high-k dielectric 154. In an example embodiment the NMOS high-k dielectric 154 is $HfO_2$ about 1.2 nm thick and is deposited using atomic layer deposition (ALD). The thin NMOS TiN metal gate material 156 is also deposited using ALD to a thickness of about 2 nm. As described in U.S. Pat. No. 8,643,113 hereby incorporated by reference, the thin NMOS TiN metal gate material 156 is deposited with an oxygen content of less than about $1 \times 10^{13}$ atoms/$cm^3$ within one nanometer of the top surface of the high-k gate dielectric 154 to provide a workfunction less than about 4.25 eV.

A second PMOS transistor photoresist pattern 162 is formed on the thin NMOS TiN metal gate 156 to enable the thin NMOS TiN metal gate 156 material and the NMOS high-k gate dielectric material 154 to be etched off the PMOS TiN metal gate 146 in the PMOS transistor 180 region. Photo resist 162 protects the NMOS TiN metal gate 156 from being removed from the NMOS transistor 182 region.

FIG. 3F shows the integrated circuit after the thin TiN gate film 156, and the NMOS transistor 182 high-k gate dielectric 154 are etched from the PMOS transistor area 180. The TaN film 148 serves and an etch stop for the high-k dielectric 154 etch. After the NMOS transistor 182 high-k gate dielectric 154 is removed the TaN etch stop film 148 may be removed by etching. The NMOS 182 transistor high-k gate dielectric 154 is removed to prevent capacitor formation between the NMOS 182 transistor TiN metal gate film 156 and the PMOS 180 transistor TiN metal gate film 146.

As shown in FIG. 3G polysilicon gate material 110 is deposited on the PMOS 180 and NMOS 182 TiN metal gates. A transistor gate photo resist pattern 112 is formed on the polysilicon gate material 110.

The cross section in FIG. 3H is shown after the gates 120 and 122 are etched. Polysilicon 110 plus thick PMOS TiN gate material 146 is etched to form the gate 120 of the PMOS transistor 180. Polysilicon 110 plus thin NMOS TiN gate material 156 is etched to form the gate 122 of the NMOS transistor 182.

Gate extension diffusions, 126 and 130, are formed, dielectric sidewalls 124 are formed, and the deep source and drain diffusions 128 and 132 are formed after gate etch. Processing steps such as source and drain and gate silicidation and transistor channel stress enhancement are omitted for sake of clarity. Pre metal dielectric (PMD) 134 which may be comprised of several dielectric layers such as stress dielectric, gap fill dielectric, and other deposited dielectrics is then deposited over the NMOS 182 and PMOS 180 transistors.

The PMD dielectric 134 may be planarized using CMP and contacts may be formed to the deep source and drain diffusions, 128, 132, and to the transistor gates, 120 and 122, to electrically connect them to a first layer of interconnect. Additional layers of dielectric and additional levels of interconnect may be formed to complete the integrated circuit.

The advantages of the embodiment 3 pattern high-k last, metal gate first process is that the PMOS and NMOS high-k dielectrics are deposited immediately before the PMOS and NMOS TiN metal gates are deposited. There is no degradation of the high-k dielectric due to layers being chemically stripped off the surface prior to the TiN metal gate deposition. In addition the high-k dielectric for NMOS is deposited using a different process step than the high-k dielectric for the PMOS so if desired different high-k dielectrics may be used on the NMOS and PMOS transistors.

Figure 4A:
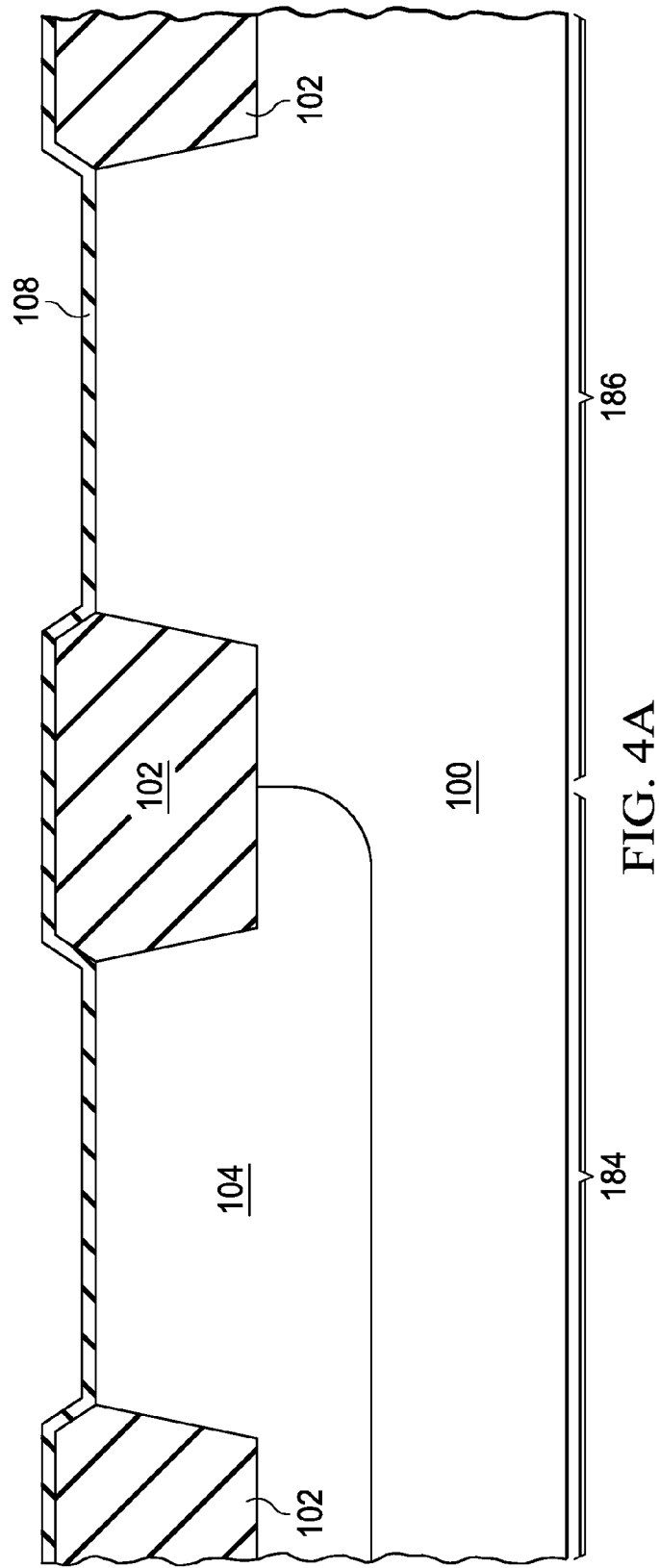
FIGS. 4A-4F are illustrations of steps in the fabrication of integrated circuits with high-k first, metal gate first CMOS transistors formed according to principles of the invention.
Figure 4B:
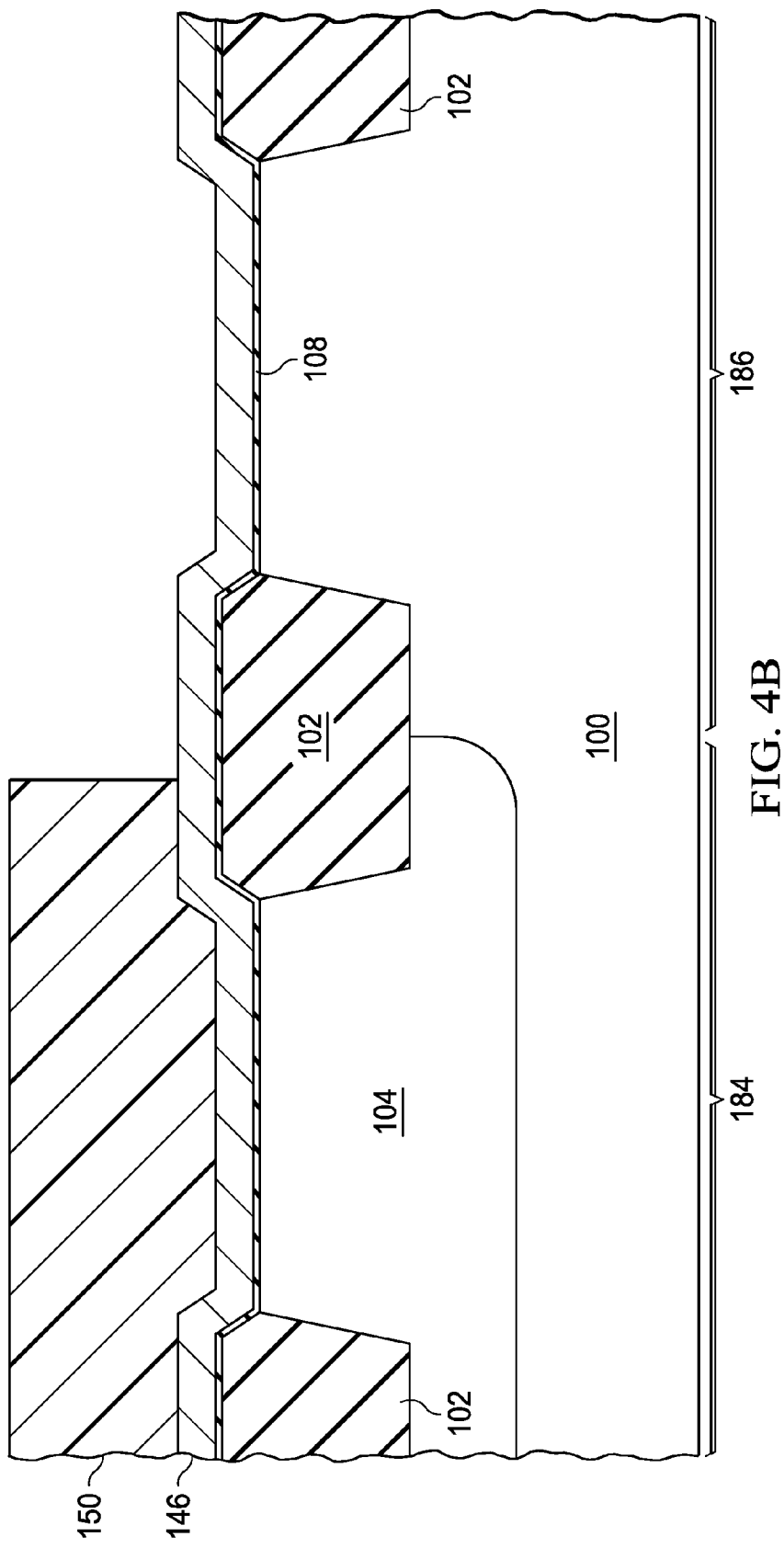
Figure 4C:
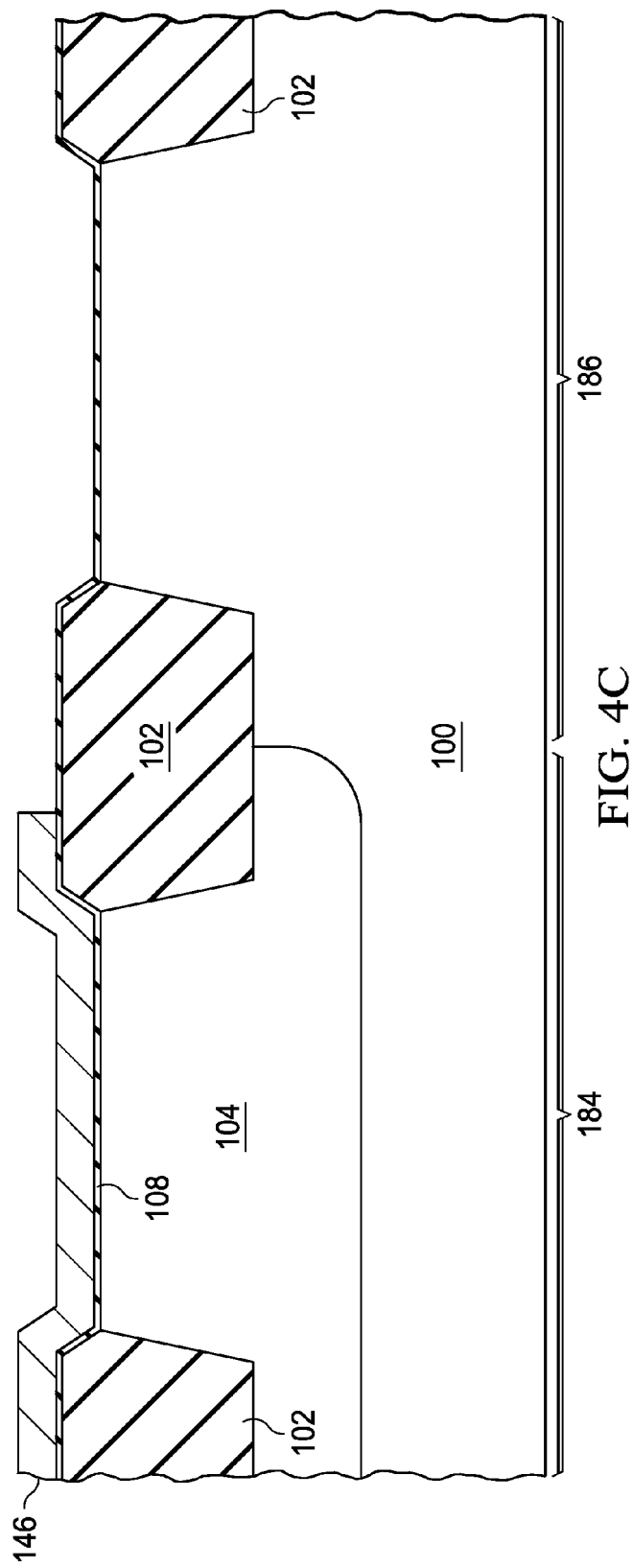
Figure 4D:
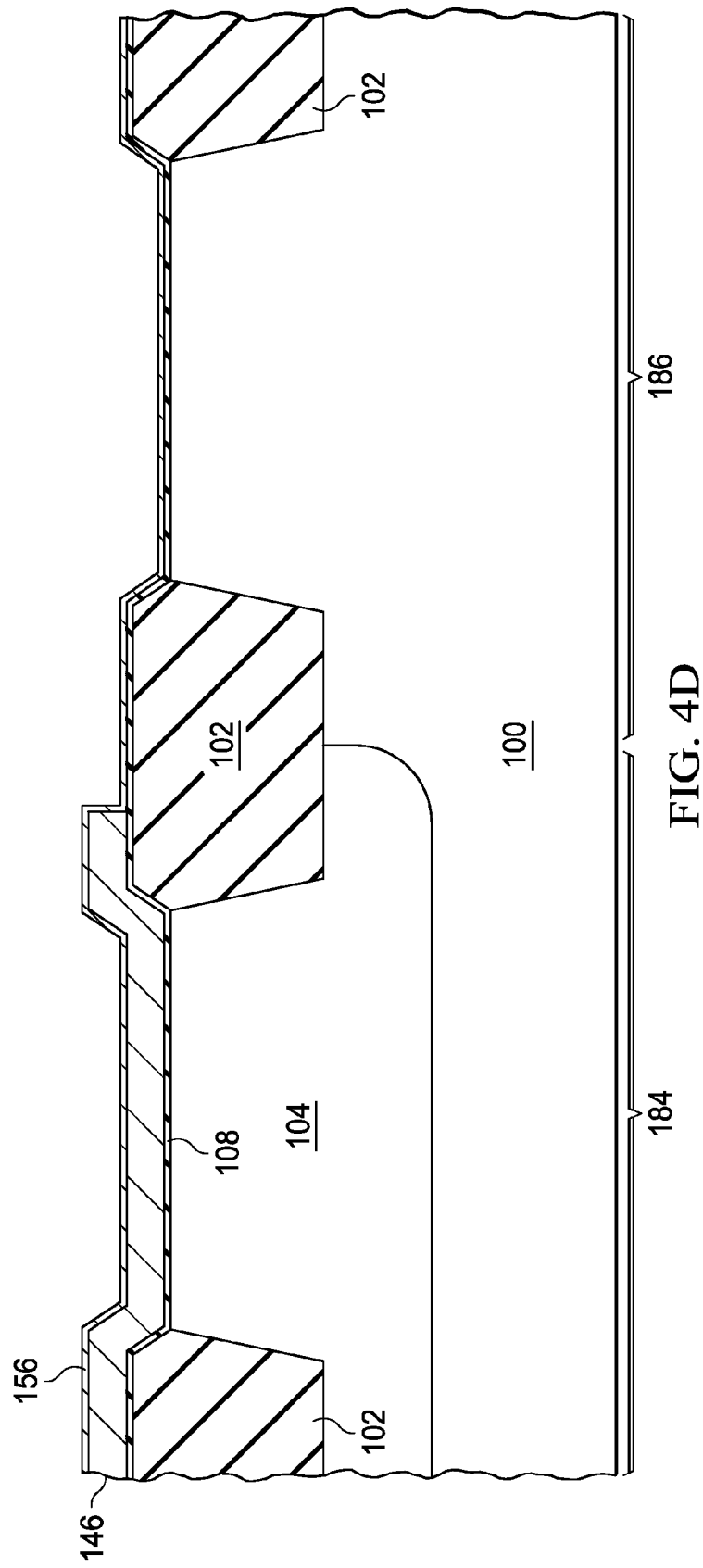
Figure 4E:
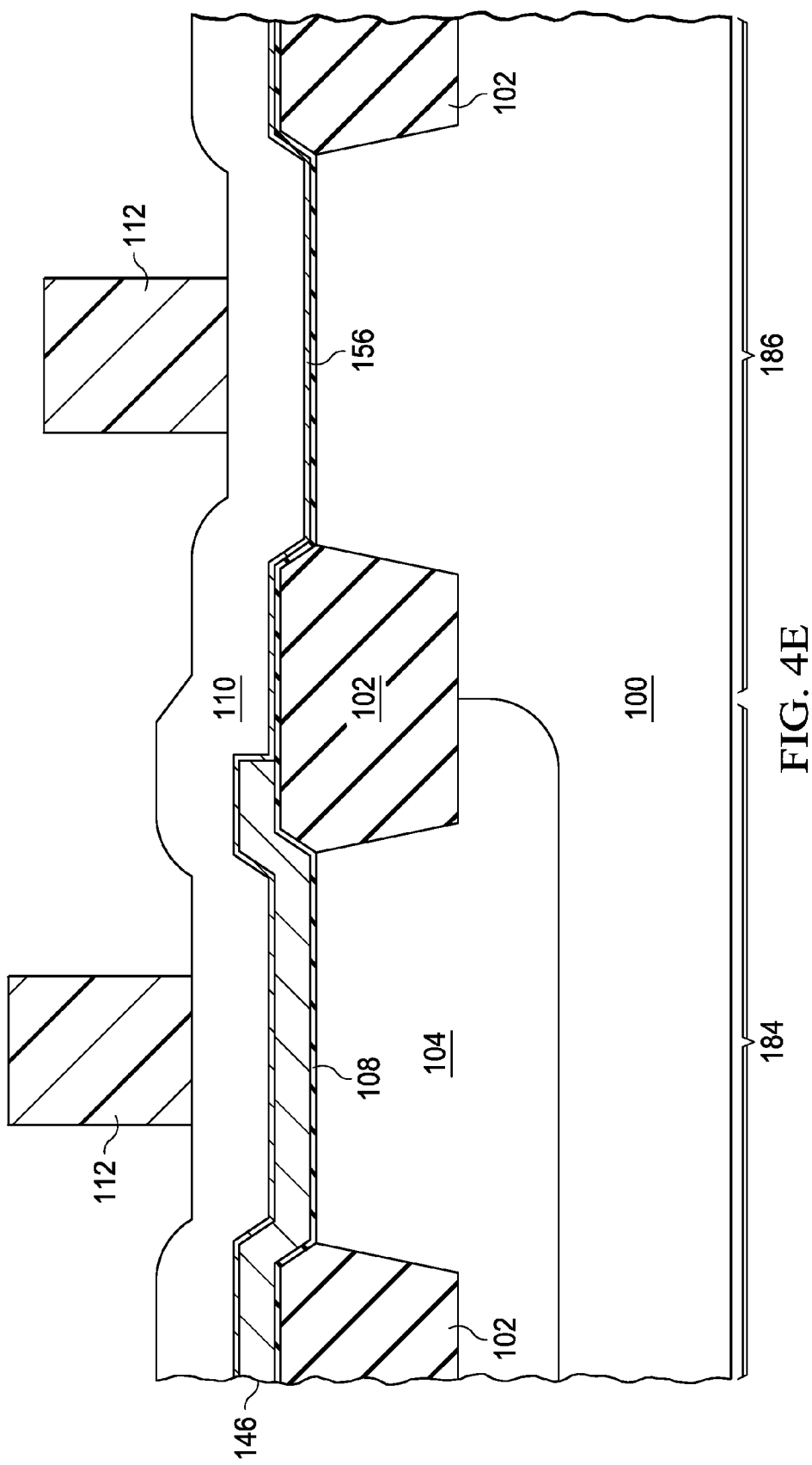
Figure 4F:
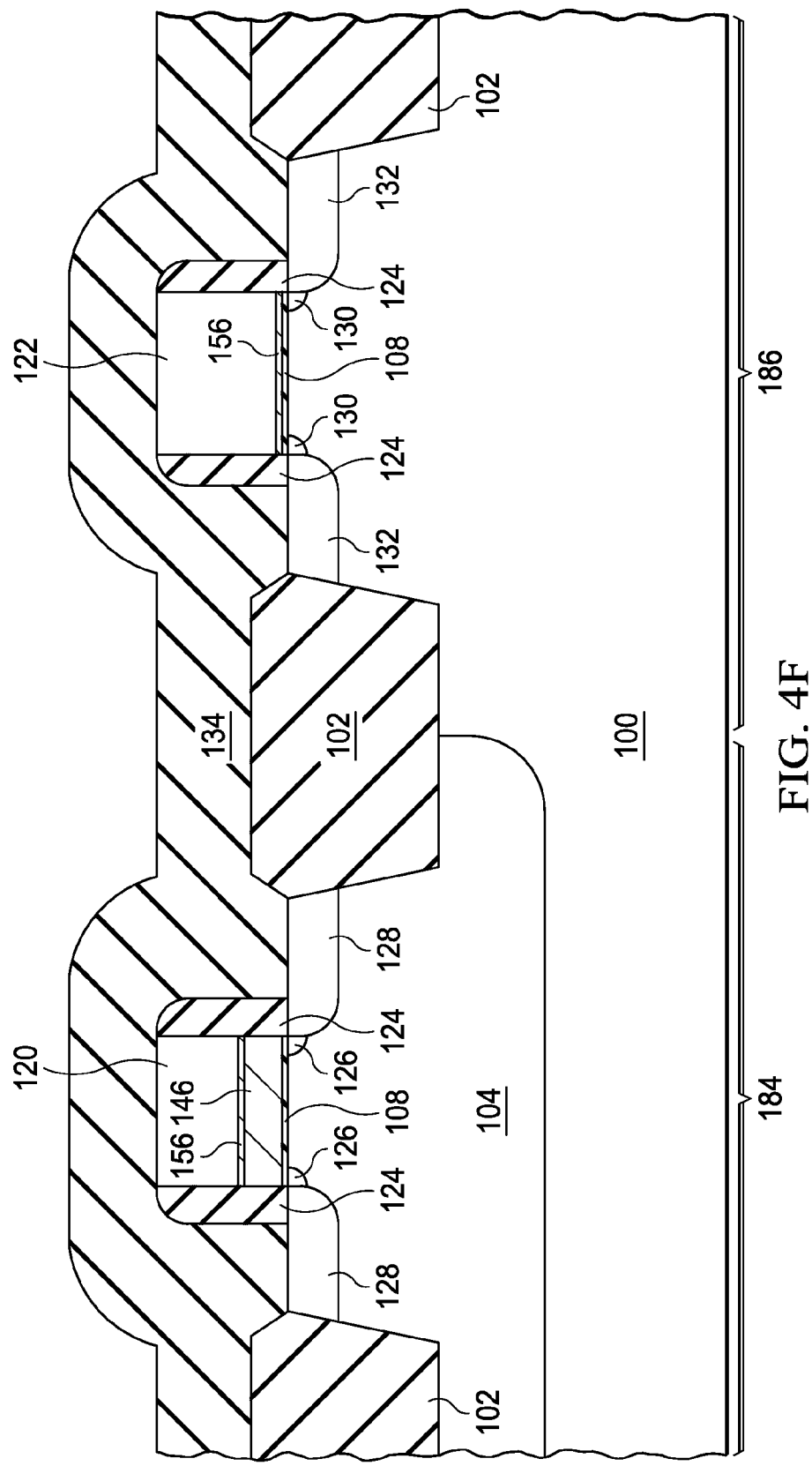

High-k first, gate first CMOS transistors formed according to a one pattern embodiment process are shown in FIG. 4F. PMOS transistor 184 has high-k dielectric 108 and PMOS TiN metal gate 146. The thickness and oxygen content of the PMOS TiN metal gate material 146 is optimized to give a workfunction greater than about 4.85 eV. NMOS transistor 186 has high-k dielectric, 108, and NMOS TiN metal gate 156. The thickness and oxygen content of the TiN NMOS metal gate material 156 is optimized to give a workfunction less than about 4.25 eV. Doped polysilicon is deposited on the TiN metal gates and then patterned and etched to form the gates 120 and 122 of the embodiment high-k first, metal gate first PMOS and NMOS transistors, 184 and 186.

The major steps for an embodiment one pattern high-k first, metal gate first process are illustrated in FIG. 4A through 4H. This embodiment high-k first, metal gate first one pattern process is more cost effective than the embodiment high-k last, metal gate first three pattern process.

The partially processed integrated circuit in FIG. 4A is formed on a p-type substrate 100. Shallow trench isolation (STI) dielectric geometries 102 electrically isolate transistors and other devices on the integrated circuit. An nwell 104 is formed in the region where the PMOS transistor 184 is to be formed by counter doping the p-type substrate 100 in the usual manner. An NMOS transistor 186 will be formed in the p-type substrate 100.

A high-k dielectric film 108 with a thickness typically in the range of approximately 1 nm to 4 nm is deposited on the integrated circuit substrate 100. In an example embodiment high-k first metal gate first process the high-k dielectric is a $HfO_2$ dielectric film deposited with a thickness of approximately 1.2 nm using ALD.

Referring now to FIG. 4B thick PMOS TiN metal gate material 146 is deposited on the high-k dielectric film 108. The PMOS TiN metal gate material 146 is deposited with a thickness greater than about 8 nm. In an example embodiment integrated circuit, the PMOS TiN metal gate material is deposited using ALD to a thickness of about 10 nm.

The PMOS TiN metal gate then annealed in oxygen as described in U.S. Pat. No. 8,643,113 hereby incorporated for reference to provide a workfunction above 4.85 eV.

An NMOS transistor 186 photo resist pattern 150 is formed to protect the PMOS TiN metal gate material 146 over the PMOS transistor area 184 and to enable it to be removed from the NMOS area 186.

As shown in FIG. 4C the PMOS TiN metal gate material 146 is removed from the NMOS 184 transistor area. A highly selective etch is used to remove the PMOS TiN metal gate material 146 from the high-k gate dielectric 108 in the NMOS transistor 186 region so as not to damage the high-k gate dielectric 108. In an example embodiment a wet etchant comprised of diluted SC1, $NH_4OH$, and $H_2O_2$ is used to etch the PMOS TiN metal gate material 146.

Thin NMOS TiN metal gate material 156 is deposited on the high-k dielectric 108 in the NMOS 186 transistor area. The thin NMOS TiN metal gate material 156 may be deposited with a thickness in the range of about 1 nm to 3 nm. In an example embodiment about 2 nm of the NMOS TiN metal gate material 156 is deposited using ALD. As described in U.S. Pat. No. 8,643,113 hereby incorporated by reference, the thin NMOS TiN metal gate material 156 is deposited with an oxygen content of less than about $1\times10^{13}$ atoms/$cm^3$ within one nanometer of the top surface of the high-k gate dielectric 108 to provide a workfunction less than about 4.25 eV.

As shown in FIG. 4E polysilicon gate material 110 is deposited on the PMOS 184 and NMOS 186 TiN metal gate material 146 and 156. A transistor gate photo resist pattern 112 is formed on the polysilicon gate material 110.

The cross section in FIG. 4F shows the integrated circuit after the gates 120 and 122 are etched. Polysilicon 110 plus NMOS TiN metal gate material 156 and PMOS TiN metal gate material 146 are etched to form the gate 120 of the PMOS high-k metal gate transistor 184. Polysilicon 110 plus NMOS TiN metal gate material 156 is etched to form the gate 122 of the NMOS high-k metal gate transistor 186.

Gate extension diffusions, 126 and 130, are formed, dielectric sidewalls 124 are formed, and the deep source and drain diffusions 128 and 132 are formed after gate etch. Additional processing steps such as source and drain and gate silicidation and stress enhancement of the transistor channels are omitted for clarity. Pre metal dielectric (PMD) 134 which may be comprised of several dielectric layers such as stress dielectric, gap fill dielectric, and other deposited dielectrics is then deposited over the high-k first, metal gate first transistors 184 and 186.

The PMD dielectric 134 may be planarized using CMP and contacts may be formed to the deep source and drain diffusions, 128 and 132, and to the transistor gates, 120 and 122 to electrically connect them to a first layer of interconnect. Additional layers of dielectric and more levels of interconnect may be formed to complete the integrated circuit.

Those skilled in the art to which this invention relates will appreciate that many other embodiments and variations are possible within the scope of the claimed invention.

What is claimed is:

1. A process of forming an integrated circuit, comprising the steps of:
    forming a thick TiN layer in both a PMOS transistor area and an NMOS transistor area;
    annealing the thick TiN layer in oxygen to raise a work function to greater than 4.85 eV;
    after annealing, removing the thick TiN layer in the NMOS transistor area; and
    after removing the thick TiN layer, forming a thin TiN layer in both the PMOS transistor area and in the NMOS transistor area, the thin TiN layer being thinner than the thick TiN layer and having a reduced oxygen concentration to result in a work function of less than 4.25 eV in the NMOS transistor area.

2. The process of claim 1, wherein the thick TiN metal gate material has a thickness greater than 8 nm and where the thin TiN metal has a thickness between 1 to 3 nm.

3. The process of claim 1, wherein the thick TiN metal gate material has a thickness of 10 nm and where the thin TiN metal has a thickness of 2 nm.

4. The process of claim 1, wherein the PMOS transistor is a gate first metal gate PMOS transistor and where the NMOS transistor is a gate first metal gate transistor further comprising the steps of:
    depositing doped polysilicon on the thin TiN layer;
    forming a transistor gate pattern on the doped polysilicon with a PMOS transistor gate pattern and with an NMOS transistor gate pattern;
    etching the doped polysilicon and the thin TiN layer and the thick TiN layer to form a gate of the PMOS transistor; and
    etching the polysilicon and the thin TiN layer to form a gate of the NMOS transistor.

5. The process of claim 1, wherein the PMOS transistor is a replacement metal gate PMOS transistor and where the NMOS transistor is a replacement metal NMOS transistor further comprising the steps of:
    prior to the step of forming the thick TiN layer;
    removing a polysilicon gate from an NMOS replacement gate transistor to form an NMOS replacement gate transistor trench in the NMOS transistor area; and
    removing a polysilicon gate from a PMOS replacement gate transistor to form a PMOS replacement gate transistor trench in the PMOS transistor area.

6. The process of claim 1, wherein the PMOS transistor is a high-k last, gate first metal gate PMOS transistor and where the NMOS transistor is a high-k last, gate first metal gate transistor further comprising the steps of:
    prior to the step of forming the thick TiN layer, depositing a first high-k dielectric in both the PMOS transistor area and in the NMOS transistor area;
    prior to the step of forming the thin TiN layer removing the first high-k dielectric from the NMOS transistor area and depositing a second high-k dielectric in the NMOS transistor area and in the PMOS transistor area;
    after the step of forming the thin TiN layer, removing the thin TiN layer from the PMOS transistor area and removing the second high-k dielectric from the PMOS transistor area;
    depositing doped polysilicon in the PMOS transistor area and in the NMOS transistor area;
    forming a transistor gate pattern on the doped polysilicon with a PMOS transistor gate pattern and with an NMOS transistor gate pattern;
    etching the polysilicon and the thick TiN layer to form a gate of the PMOS transistor; and
    etching the polysilicon and the thin TiN layer to form a gate of the NMOS transistor.

7. The process of claim 6, wherein the first and second high-k dielectrics are 1.2 nm $HfO_x$, where the thick TiN has a thickness of 10 nm thick and where the thin TiN has a thickness of 2 nm.

8. The process of claim 1, wherein the PMOS transistor is a high-k last replacement metal gate PMOS transistor and where the NMOS transistor is a high-k last replacement metal NMOS transistor further comprising the steps of:
    prior to the step of forming the thick TiN layer;

removing a polysilicon gate from an NMOS replacement gate transistor to form an NMOS replacement gate transistor trench in the NMOS transistor area;

removing a polysilicon gate from a PMOS replacement gate transistor to form a PMOS replacement gate transistor trench in the PMOS transistor area;

depositing a first high-k dielectric in the PMOS replacement gate transistor trench and in the NMOS transistor area;

prior to the step of forming the thin TiN layer removing the first high-k dielectric from the NMOS transistor area and depositing a second high-k dielectric on the PMOS transistor area and in the NMOS replacement gate transistor trench;

after the step of forming the thin TiN layer;

removing the thin TiN layer from the PMOS transistor area; and removing the second high-k dielectric from the PMOS transistor area.

9. The process of claim 8, wherein the first and second high-k dielectrics are 1.2 nm $HfO_x$, where the thick TiN has a thickness of 10 nm and where the thin TiN has a thickness of 2 nm.

10. A process of forming an integrated circuit with replacement metal gate CMOS transistors, comprising the steps:

providing a partially processed integrated circuit with a PMOS transistor with a first polysilicon gate on a first gate dielectric and an NMOS transistor with a second polysilicon gate on a second gate dielectric and with premetal dielectric that overlies the NMOS and PMOS transistors and wherein the premetal dielectric is planarized exposing the top surface of the first and second polysilicon gates;

etching to remove the first and second polysilicon gates from first and second gate dielectric to form a PMOS and an NMOS replacement gate transistor trench;

depositing a first high-k dielectric in the PMOS replacement gate transistor trench;

depositing at least 8 nm of PMOS TiN metal gate material on the first high-k dielectric in the PMOS replacement gate transistor trench and on a second high-k dielectric in the NMOS replacement gate trench;

annealing the PMOS metal gate material in oxygen to raise the work function to greater than 4.85 eV forming an NMOS metal gate pattern with an opening over the NMOS replacement gate transistor trench;

etching the PMOS metal gate material from the NMOS replacement gate transistor trench to remove it from an underlying dielectric;

removing the NMOS metal gate pattern;

depositing second high-k dialectic in the NMOS replacement gate transistor trench;

depositing between about 1 nm and 3 nm NMOS TiN metal gate material with a reduced oxygen concentration and a work function of less than about 4.25 eV on the second high-k dielectric;

depositing a filler metal over the NMOS TiN metal gate material to overfill the PMOS replacement gate transistor trench and to overfill the NMOS replacement gate transistor trench; and polishing to remove the overfill, and portions of the PMOS TiN metal gate material and the NMOS TiN metal gate material from the surface of the premetal dielectric.

11. The process of claim 10, wherein the process is a high-k last process and where the underlying dielectric is the second gate dielectric and further comprising:

prior the step of depositing the first high-k dielectric forming a first PMOS transistor photo resist pattern with an opening over the PMOS replacement gate transistor trench;

etching the first gate dielectric from the PMOS replacement gate transistor trench; and after the etching the first gate dielectric step, stripping the first PMOS transistor photo resist pattern;

prior to the step of depositing second high-k dielectric etching the second gate dielectric from the NMOS replacement gate transistor trench;

prior to the step of depositing the filler metal; forming a second PMOS transistor photo resist pattern on the integrated circuit with an opening over the PMOS replacement gate transistor trench;

etching the NMOS TiN metal gate material;

etching the NMOS high-k dielectric; and removing the second PMOS transistor photo resist pattern prior the step of depositing the filler metal.

12. The process of claim 10, wherein the process is a high-k first process and where the underlying dielectric is the second high-k dielectric and further comprising:

prior to the step of depositing a first high-k dielectric, etching the first gate dielectric and the second gate dielectric; and where the step of depositing the first high-k dielectric, deposits the first high-k dielectric into the PMOS replacement gate transistor trench and deposits the second high-k dielectric into the NMOS replacement gate transistor trench and where the first high-k dielectric and the second high-k dielectric are the same high-k dielectric.

13. The process of claim 10, wherein the etching the PMOS TiN metal gate material step is a wet etch in dilute SC1 plus $NH_4OH$ and $H_2O_2$.

14. The process of claim 10, wherein the first and second high-k dielectrics are 1.2 nm $HfO_x$, where the PMOS TiN metal gate material is 10 nm thick and where the NMOS TiN metal gate material is 2 nm thick.

15. A process of forming an integrated circuit with metal gate first CMOS transistors, comprising the steps:

providing a partially processed integrated circuit with shallow trench isolation separating a first region with a first sacrificial dielectric where a PMOS metal gate transistor is to be formed from a second region with a second sacrificial dielectric where an NMOS metal gate transistor is to be formed;

depositing a first high-k dielectric where the PMOS metal gate transistor is to be formed;

depositing at least 8 nm of PMOS TiN metal gate material on the first high-k dielectric;

annealing the PMOS metal gate material in oxygen to raise the work function to greater than 4.85 eV forming an NMOS metal gate pattern on the PMOS metal gate material with an opening where the NMOS metal gate transistor is to be formed;

etching the PMOS TiN metal gate material to remove it from an underlying dielectric;

depositing second high-k dielectric where the NMOS metal gate transistor is to be formed;

depositing between 1 nm and 3 nm NMOS TiN metal gate material with a reduced oxygen concentration and with a work function of less than 4.25 eV;

depositing polysilicon over the NMOS TiN metal gate material;

forming a transistor gate pattern on the polysilicon with resist geometries where gates of the NMOS and PMOS transistor gates are to be formed; and etching the polysilicon and the PMOS TiN metal gate material to form the PMOS transistor gate; and etching the polysilicon and the NMOS TiN metal gate material to form the NMOS transistor gate.

16. The process of claim 15, wherein the process is a high-k last process and wherein the underlying dielectric is the second sacrificial dielectric and further comprising:

prior to the step of depositing the first high-k dielectric;
forming a first PMOS transistor photo resist pattern on the integrated circuit with an opening over the PMOS replacement gate transistor trench;
etching the first sacrificial dielectric; and
stripping the first PMOS transistor photo resist pattern;

prior to the step of depositing the second high-k dielectric etching and removing the second sacrificial dielectric; and prior to the step of depositing the polysilicon; forming a second PMOS transistor photo resist pattern on the integrated circuit with an opening where the PMOS transistor is to be formed;
etching the NMOS TiN metal gate material;
etching the NMOS high-k dielectric; and
removing the second PMOS transistor photo resist pattern.

17. The process of claim 15, wherein the process is a high-k first process and wherein the underlying dielectric is the second high-k dielectric and further comprising:

prior to the step of depositing the first high-k dielectric etching the first sacrificial dielectric and etching the second sacrificial oxide; and where the step of depositing the first high-k dielectric, deposits the first high-k dielectric where the PMOS metal gate transistor is to be formed and deposits the second high-k dielectric where NMOS metal gate transistor is to be formed and where the first high-k dielectric and the second high-k dielectric are the same high-k dielectric.

18. The process of claim 15, wherein the etching the PMOS TiN metal gate material step is a wet etch in dilute SC1 plus $NH_4OH$ and $H_2O_2$.

19. The process of claim 8, wherein the first and second high-k dielectrics are 1.2 nm $HfO_x$, where the PMOS TiN metal gate material is 10 nm thick and where the NMOS TiN metal gate material is 2 nm thick.

* * * * *